(12) United States Patent
Namerikawa et al.

(10) Patent No.: US 6,941,625 B2
(45) Date of Patent: Sep. 13, 2005

(54) METHOD OF PRODUCING A PIEZOELECTRIC/ELECTROSTRICTIVE DEVICE

(75) Inventors: Masahiko Namerikawa, Seto (JP); Kazuyoshi Shibata, Mizunami (JP); Masaki Iwamoto, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/950,617

(22) Filed: Sep. 27, 2004

(65) Prior Publication Data

US 2005/0035690 A1 Feb. 17, 2005

Related U.S. Application Data

(62) Division of application No. 10/631,293, filed on Jul. 31, 2003, now Pat. No. 6,813,815, which is a continuation of application No. 09/918,274, filed on Jul. 30, 2001, now abandoned.

(51) Int. Cl.[7] .......................... H04R 17/00; H01L 41/04; H01L 41/08; H01L 41/18
(52) U.S. Cl. .......................... 29/25.35; 29/830; 29/831; 29/426.1; 29/426.2; 29/762; 29/851; 310/367
(58) Field of Search .................... 29/25.35, 830, 29/831, 426.1, 426.2, 762, 851; 310/326, 322, 367, 324, 334; 156/89.11, 89.2–6, 101; 427/58, 79; 428/292; 264/618

(56) References Cited

U.S. PATENT DOCUMENTS

| | | | |
|---|---|---|---|
| 3,474,268 A | | 10/1969 | Rudnick |
| 3,679,950 A | * | 7/1972 | Rutt .......................... 361/321.4 |
| 3,879,643 A | | 4/1975 | Hubbard |
| 4,353,957 A | * | 10/1982 | Rutt et al. .................. 428/110 |
| 4,523,121 A | | 6/1985 | Takahashi et al. |
| 4,632,856 A | | 12/1986 | Marcus et al. |
| 4,814,659 A | | 3/1989 | Sawada |
| 4,889,760 A | * | 12/1989 | Kippenberg et al. ......... 428/192 |
| 4,906,512 A | * | 3/1990 | Roess .......................... 428/192 |
| 5,043,621 A | | 8/1991 | Culp |

(Continued)

FOREIGN PATENT DOCUMENTS

| | | |
|---|---|---|
| DE | 197 32 571 | 7/1998 |
| EP | 1 091 424 | 4/2001 |
| JP | 61-182284 | 8/1986 |
| JP | 63-295269 | 12/1988 |
| JP | 4-309274 | 10/1992 |

OTHER PUBLICATIONS

U.S. Appl. No. 09/672,069, filed Sep. 28, 2000, Takeuchi et al.

Smith N.C., "Tapered Piezoelectric Actuator", IBM Technical Disclosure Bulletin, vol. 27, No. 6, Nov. 1, 1984, pp. 3568.

Primary Examiner—A. Dexter Tugbang
Assistant Examiner—Tai Nguyen
(74) Attorney, Agent, or Firm—Burr & Brown

(57) ABSTRACT

A method of producing a piezoelectric/electrostrictive device in which a piezoelectric/electrostrictive element including a substantially trapezoidal laminate having narrower and wider surfaces lying substantially in parallel to each other and first and second surfaces opposed to each other between the narrower and wider surfaces. The first and second surfaces are inclined at given angles to one of the narrower and wider surfaces. The laminate includes piezoelectric/electrostrictive layers and interposed internal electrodes, the internal electrodes being broken up into a first and a second group, each of the first group internal electrodes lying over one of the second group internal electrodes through one of the piezoelectric/electrostrictive layers. A first external electrode is formed on the first surface of the laminate and is coupled to the first group internal electrodes. A second external electrode is formed on the second surface of the laminate and is coupled to the second group internal electrodes.

3 Claims, 26 Drawing Sheets

U.S. PATENT DOCUMENTS

| | | |
|---|---|---|
| 5,153,477 A | 10/1992 | Jomura et al. |
| 5,182,484 A | 1/1993 | Culp |
| 5,237,239 A | 8/1993 | Inoue et al. |
| 5,281,899 A | 1/1994 | Culp |
| 5,601,673 A * | 2/1997 | Alexander ............... 156/89.12 |
| 5,939,816 A | 8/1999 | Culp |
| 6,274,966 B1 | 8/2001 | Kohno et al. |
| 6,414,418 B1 | 7/2002 | Heinz et al. |
| 2002/0194717 A1 | 12/2002 | Takeuchi et al. |

* cited by examiner

METHOD OF PRODUCING A PIEZOELECTRIC/ELECTROSTRICTIVE DEVICE

CROSS REFERENCE TO RELATED APPLICATIONS

This application is a division of U.S. application Ser. No. 10/631,293, filed Jul. 31, 2003, now U.S. Pat. No. 6,813,815 allowed, which is a continuation of U.S. application Ser. No. 09/918,274, filed Jul. 30, 2001, now abandoned, the entireties of which are incorporated herein by reference.

FIELD OF THE INVENTION

The present invention relates generally to a piezoelectric/electrostrictive element, a piezoelectric/electrostrictive device and a production method thereof, and more particularly to a laminated piezoelectric/electrostrictive element and a laminated piezoelectric/electrostrictive device made up of piezoelectric/electrostrictive layers and internal electrode layers laminated alternately, and a production method thereof.

BACKGROUND OF THE INVENTION

In recent years, a variety of fields such as optics, magnetic recording, precision machining, and printing demand a displacement element for controlling, for example, the length or position of an optical path in the order of a submicron or vibrations precisely. As such a displacement element meeting the above demand, there is one employing displacement provided by a reverse piezoelectric effect or an electrostrictive effect taken place when the voltage is applied to a piezoelectric/electrostrictive material made of, for example, a ferroelectric substance.

Conventionally, as such a displacement element, a laminated piezoelectric element 100, as shown in FIG. 34, which is disclosed in Japanese Patent First Publication No. 4-309274 is known. The piezoelectric/electrostrictive element 100 includes, as shown in FIG. 34, a lamination 104 formed by laminating a plurality of piezoelectric ceramic layers 101 and electrode layers 102 alternately and a pair of electrically insulated external electrodes 104 and 105 which connect the electrode layers 102 alternately on opposed side surfaces of the laminate 103 and are so formed as to extend to upper and lower surfaces of the laminate 103. In the laminated piezoelectric element 100, ridges defined by the side surfaces and the upper and lower surfaces of the laminate 103 are rounded to an extent where the radius of curvature of the ridges exceeds half the thickness of the piezoelectric ceramic layers 101.

The production of the laminated piezoelectric element 100 shown in FIG. 34 is accomplished by first weighing and grinding raw material, mixing it with binder, and defoaming the mixture, after which the mixture is shaped into a sheet from which rectangular green sheets 101A are punched (which will be the piezoelectric ceramic layers 101 by baking). A conductive paste is printed over a given area of one surface of the green sheet 101A to form the electrode layer 102. Next, the green sheets 101A on which the electrode layers 102 are printed properly are, as shown in FIG. 35, laminated and bonded by pressure and cut as needed after which it is baked to produce the laminate 103 as shown in FIG. 36. As a result, the green sheets 101A are, as mentioned above, baked to produce the piezoelectric ceramic layers 101. In the laminate 103, arrangement positions of the electrode layers 102 are predetermined on a pair of opposed side surfaces thereof so that the electrode layers 102 may be exposed alternately. Afterwards, on given areas of upper and lower surfaces of the thus produced laminate 103, an external upper surface electrode 104A, and an external lower surface electrode 105A are formed. Next, on a pair of opposed side surfaces 106 and 107 to which the electrode layers 102 of the laminate 103 are exposed alternately, external side surface electrodes (thick film electrodes) 104B and 105B are formed to make the laminated piezoelectric element 100 shown in FIG. 34. The external side surface electrode 104B is so formed as to connect with the external upper surface electrode 104A, while the external side surface electrode 105B is so formed as to connect with the external lower surface electrode 105A. As a method of forming the above-mentioned external electrodes 104 and 105, there is a dipping method or an evaporation method.

FIG. 37 shows an actuator 200 utilizing the thus constructed laminated piezoelectric element 100. The actuator 200 has the laminated piezoelectric element 100 secured on a movable plate (diaphragm) 110 by an adhesive 111.

As another displacement element, a piezoelectric displacement element, as disclosed in Japanese Patent First Publication No. 63-295269, is known which is equipped with a plurality of opposed inner electrode layers in a ceramic thin plate exhibiting the piezoelectric effect. Corners that are boundaries of side surfaces and upper and lower surfaces of the ceramic thin plate are chamfered mechanically. On front and reverse surfaces and the opposed side surfaces of the ceramic thin plate, a pair of opposed surface electrodes connecting with internal electrode layers is so formed that the electrodes are electrically insulated from each other. The opposed surface electrodes are formed on the surfaces of the ceramic thin plate by a physical vapor deposition method such as a sputtering method or a vapor deposition method or a film forming method such as plating.

SUMMARY OF THE INVENTION

The laminated piezoelectric element 100, as shown in FIG. 34, has problems in that the possibility that edges of the green sheets 101A (shown in FIG. 35) are deformed, damaged, or broken by handling is high. Particularly, a thin piezoelectric element in which a total film thickness (thickness) of the laminate 103 is 100 μm or less has a high possibility that the green sheets 101A are broken by handling. The conventional laminated piezoelectric element 100, thus, has a problem that the fabrication yield is low.

The piezoelectric displacement element, as disclosed in Japanese Patent First Publication No. 63-295269 is chamfered by mechanically cutting end portions of the ceramic thin film diagonally, which results in an increase in production processes. The mechanical cutting may also cause damage to the ceramic thin film.

The invention was made in order to solve the above problems. It is, thus, an object of the invention to provide a piezoelectric/electrostrictive element and a piezoelectric/electrostrictive device which are excellent in strength, shock resistance, handling, dimensional accuracy, positional accuracy, stability of element characteristics, and fabrication yield, and to provide a production method thereof.

In order to solve the above problems, the first feature of the invention lies in a piezoelectric/electrostrictive element including a substantially trapezoidal laminate having narrower and wider surfaces lying substantially in parallel to each other and first and second surfaces opposed to each other between the narrower and wider surfaces. The first and second surfaces are inclined at given angles with respect to one of the narrower and wider surfaces. The trapezoidal laminate is made up of a plurality of piezoelectric/electrostrictive layers and a plurality of internal electrodes, each of which is disposed between an adjacent two of the piezoelectric/electrostrictive layers. The internal electrodes are divided into a first and a second group, each of the first group internal electrodes lying over one of the second group internal electrodes through one of the piezoelectric/electrostrictive layers. A first external electrode is formed on the first surface of the laminate, and is coupled to the first group internal electrodes; and a second external electrode formed on the second surface of said laminate, said second external electrodes being coupled to the second group internal electrodes.

The thus constructed piezoelectric/electrostrictive element is of a substantially trapezoidal shape which decreases in width from one of the bottom surfaces to the other bottom surface, so that the angle which the slant surfaces of both sides make with the other bottom surface is obtuse, thus resulting in an increase in strength of a ridge portion (a corner) defined by the other bottom surface and the slant surfaces. Therefore, for example, when the other (narrower) bottom surface is secured on a movable plate (diaphragm), the breakage or damage of the ridge portion caused by an external force or vibrations of the piezoelectric/electrostrictive element itself is avoided. When the other bottom surface of the piezoelectric/electrostrictive element is secured on the movable plate (diaphragm) by adhesive, a recess-shaped (V-groove shaped) gap defined by the movable plate and the slant surfaces of both the sides of the piezoelectric/electrostrictive element can be filled with the adhesive, thereby resulting in a further increase in force (bonding strength) which secures the piezoelectric/electrostrictive element to the movable plate. The existence of the adhesive in the recess-shaped gap offers the effect of avoiding removal of the piezoelectric/electrostrictive element from the movable plate even if the stress arising from a difference in thermal expansion between the piezoelectric/electrostrictive element and the movable plate is produced.

The piezoelectric/electrostrictive layers are decreased in width gradually in one of the directions of lamination. Thus, for example, when the external electrode layers, the piezoelectric/electrostrictive layers, and the internal electrode layers are laminated in a given order, it is possible to pile up the piezoelectric/electrostrictive layers on a backing layer stably. Therefore, when the external electrode layers, the piezoelectric/electrostrictive layers, and the internal electrode layers are laminated by printing using, for example, a screen printing method, the printing is achieved easily since a lower one of the piezoelectric/electrostrictive layers has an area greater than that of an upper one of the piezoelectric/electrostrictive layers. The screen printing method makes it possible to apply, for example, via a conductive paste, the external electrode layers to the slant surface (a side surface portion) of the laminate.

Both the external electrode layers formed on the side surface portions extend along the wider surface of said laminate, thereby ensuring a joint area (a pad portion) which establishes a joint of wires for applying a drive voltage to the external electrode layers or wires for detecting a produced voltage, which facilitates connection of the wires. Particularly, as described above, when the narrower bottom surface of the laminate is secured on the movable plate, it is possible to bond the wires on a sufficient area of the wider bottom surface. The width of one of the external electrode layers extending on the wider bottom surface of the laminate is greater, thereby allowing the one of the external electrode layers to be used as a voltage applying electrode or a voltage detecting electrode.

Additionally, one of the surfaces of the piezoelectric/electrostrictive element may be formed by a piezoelectric/electrostrictive layer to increase a bonding strength using adhesive has the affinity to the piezoelectric/electrostrictive layers, for example, when the side of the piezoelectric/electrostrictive layer is bonded to the movable plate.

The second feature of the invention lies in a piezoelectric/electrostrictive device in which a piezoelectric/electrostrictive element includes a substantially trapezoidal laminate having narrower and wider surfaces lying substantially in parallel to each other and first and second surfaces opposed to each other between the narrower and wider surfaces. The first and second surfaces are inclined at given angles with respect to one of the narrower and wider surfaces. The trapezoidal laminate is made up of a plurality of piezoelectric/electrostrictive layers and a plurality of internal electrodes, each of which is disposed between an adjacent two of the piezoelectric/electrostrictive layers. The internal electrodes are divided into a first and a second group, each of the first group internal electrodes lying over one of the second group internal electrodes through one of the piezoelectric/electrostrictive layers first external electrode is formed on the first surface of the laminate, and is coupled to the first group internal electrodes. A second external electrode is formed on the second surface of said laminate, and is coupled to the second group internal electrodes. The piezoelectric/electrostrictive element is bonded to a surface of a movable plate on a side of the narrower surface of the laminate.

In the piezoelectric/electrostrictive device, the narrower bottom surface of the laminate is bonded to the surface of the movable plate, so that a corner portion having an obtuse angle defined by the narrower bottom surface and both side surface portions engages the movable plate. The corner having the obtuse angle will have strength greater than a corner having an acute angle or a right angle and offers the effect of increasing the durability such as the strength or shock resistance of the piezoelectric/electrostrictive device.

A gap (recess) formed by both the side surface portions of the piezoelectric/electrostrictive device and the movable plate defines a liquid sump of adhesive having flowability prior to solidification and works to absorb an excess or a lack of the adhesive caused by a variation in quantity of the applied adhesive or undulations of the movable plate and the piezoelectric/electrostrictive element. The application of a proper quantity of the adhesive to a suitable area of the movable plate will enable automatic alignment of the piezoelectric/electrostrictive element with a proper position with aid of an effect such as surface tension of the adhesive within the gap.

Additionally, filling the gap with the adhesive enables firm installation of the piezoelectric/electrostrictive element on the movable plate. If the adhesive with which the gap is filled keeps the elasticity after being solidified, it alleviates the stress arising from a difference in thermal expansion between the movable plate and the piezoelectric/electrostrictive element, thereby avoiding removable of the piezoelectric/electrostrictive element from the movable plate. Specifically, the filling of the gap defined by the side portions of the piezoelectric/electrostrictive element and the movable plate with the adhesive will restrict a reduction in strength to fix the piezoelectric/electrostrictive element even if the piezoelectric/electrostrictive element is decreased in size.

Further, the external electrode layers formed on both the side surface portions of the piezoelectric/electrostrictive element extend on the wider bottom surface of the laminate, thus providing a joint area sufficient for establishing connection of external wires to the external electrode layers.

The movable plate is made of a conductive material. One of the external electrode layers of the piezoelectric/electrostrictive element is connected to the movable plate, thereby increasing a wiring space of the other external electrode layer and facilitating ease of a connecting operation.

The third feature of the invention lies in a method of producing a piezoelectric/electrostrictive element including the following steps:

a first step of preparing a ceramic substrate having a given width;

a second step of forming a laminate on the ceramic substrate, the laminate being made up of first and second portions laid to overlap one another;

a third step of baking the ceramic substrate and the laminate at a given temperature; and a fourth step of removing the laminate from the ceramic substrate;

the first portion of the laminate is formed using the following steps:

printing a first electrode layer and a second electrode layer on the ceramic substrate which are disposed at a given interval away from one another;

forming a piezoelectric/electrostrictive layer using a piezoelectric/electrostrictive paste on the first and second electrode layers so as to cover portions of the first and second electrode layers other than edge portions thereof lying outward in a widthwise direction of the ceramic substrate; and forming a first electrode layer on an upper surface and a side surface of the piezoelectric/electrostrictive layer so as to establish an electric connection only with the first electrode layer lying immediately beneath the first electrode layer formed in this step.

The second portion of the laminate is formed by performing the following set of steps a given number of times which include:

forming a piezoelectric/electrostrictive layer using a piezoelectric/electrostrictive paste on an uppermost one of the first electrode layers, the piezoelectric/electrostrictive layer formed in this step having a width smaller than that of the piezoelectric/electrostrictive layer lying immediately beneath the piezoelectric/electrostrictive layer formed in this step;

forming a second electrode layer on an upper surface and a side surface of an uppermost one of the piezoelectric/electrostrictive layers so as to establish an electric connection only with the second electrode layer lying immediately beneath the second electrode layer formed in this step;

forming a piezoelectric/electrostrictive layer using a piezoelectric/electrostrictive paste on an uppermost one of the second electrode layers, the piezoelectric/electrostrictive layer formed in this step having a width smaller than that of the piezoelectric/electrostrictive layer lying immediately beneath the piezoelectric/electrostrictive layer formed in this step; and forming a first electrode layer on an upper surface and a side surface of an uppermost one of the piezoelectric/electrostrictive layers so as to establish an electric connection only with the first electrode layer lying immediately beneath the first electrode layer formed in this step.

In the method of producing the thus constructed piezoelectric/electrostrictive element according to the third feature, it is possible to pile up the piezoelectric/electrostrictive layers by printing so that areas thereof decrease gradually, thus resulting in ease of manufacture. The piezoelectric/electrostrictive layers, the first electrode material layer, and the second electrode material layer may be formed using a printing method, thus allowing a piezoelectric/electrostrictive element to be produced which is higher in dimensional accuracy, positional accuracy, less susceptible to adverse effects, such shifting during transportation, and deformation caused by the transportation, and eliminating the need for process of transporting and piling up the piezoelectric/electrostrictive layers, which avoids breakage or damage of the piezoelectric/electrostrictive layers caused by handling thereof.

The formation of portions which become continuous external side surface electrodes on both sides of the laminate is achieved in sequence by repeating printing of the first and second electrode material layers, thus eliminating the need for a process of forming additional external side surface electrodes.

Further, a film which disappears upon baking of the laminate is preformed on a ceramic substrate used in producing the piezoelectric/electrostrictive element, thereby resulting in easy removal of the piezoelectric/electrostrictive element from the ceramic substrate when baked.

In this invention, the external side surface electrode which defines an outermost contour of the piezoelectric/electrostrictive element as viewed in a plane may be formed by printing with high positional accuracy. For example, when the piezoelectric/electrostrictive element is positioned by positioning pins to mount the piezoelectric/electrostrictive element on a movable plate, it is possible to arrange the piezoelectric/electrostrictive element with high positional accuracy.

The fourth feature of the invention lies in a method of producing a piezoelectric/electrostrictive device in which a piezoelectric/electrostrictive element includes a substantially trapezoidal laminate having narrower and wider surfaces lying substantially in parallel to one another and first and second surfaces opposed to one another between the narrower and wider surfaces. The first and second surfaces are inclined at given angles with respect to one of the narrower and wider surfaces. The trapezoidal laminate is made up of a plurality of piezoelectric/electrostrictive layers and a plurality of internal electrodes, each of which is disposed between an adjacent two of the piezoelectric/electrostrictive layers. The internal electrodes are broken up into a first and a second group, each of the first group internal electrodes lying over one of the second group internal electrodes through one of the piezoelectric/electrostrictive layers. A first external electrode is formed on the first surface of the laminate and is coupled to the first group internal electrodes. A second external electrode is formed on the second surface of the laminate and is coupled to the second group internal electrodes. The piezoelectric/electrostrictive element is bonded to a surface of a movable plate by an adhesive.

In the method of producing the thus constructed piezoelectric/electrostrictive device, the narrower bottom surface side of the laminate is bonded to the movable plate through the adhesive, thus facilitating ease of filling a gap (recess) defined by slants of both side surfaces of the piezoelectric/electrostrictive element and the movable plate with the adhesive. This allows the gap to be filled with the adhesive in quantity suitable for the size of the gap, thus ensuring the bonding strength. When piezoelectric/electrostrictive elements are joined to each other, gaps (recesses) are also formed by side surface portions of the piezoelectric/electrostrictive elements, thus offering a similar effect of increasing the bonding strength.

The narrower bottom surface of the piezoelectric/electrostrictive element is bonded to the movable plate, so that angles which the side surface portions of the piezoelectric/electrostrictive element make with the movable plate will be obtuse, thus providing the effect of avoiding local breakage or damage of the piezoelectric/electrostrictive element. The same is true for a case where piezoelectric/electrostrictive elements are bonded at narrower bottom surfaces to one another.

Automatic positioning of the piezoelectric/electrostrictive element is achieved by setting a coefficient of viscosity of the adhesive applied on the surface of the movable plate to a given value to enable the filling with adhesive of the gaps (recesses) defined by the slants of the side surfaces of the piezoelectric/electrostrictive element and the movable plate.

BRIEF DESCRIPTION OF THE DRAWINGS

For a fully understanding of the nature and objects of the invention, reference should be made to the following detailed description of a preferred mode of practicing the invention, read in connection with the accompanying drawings in which.

DETAILED DESCRIPTION OF THE INVENTION

Figure 1:
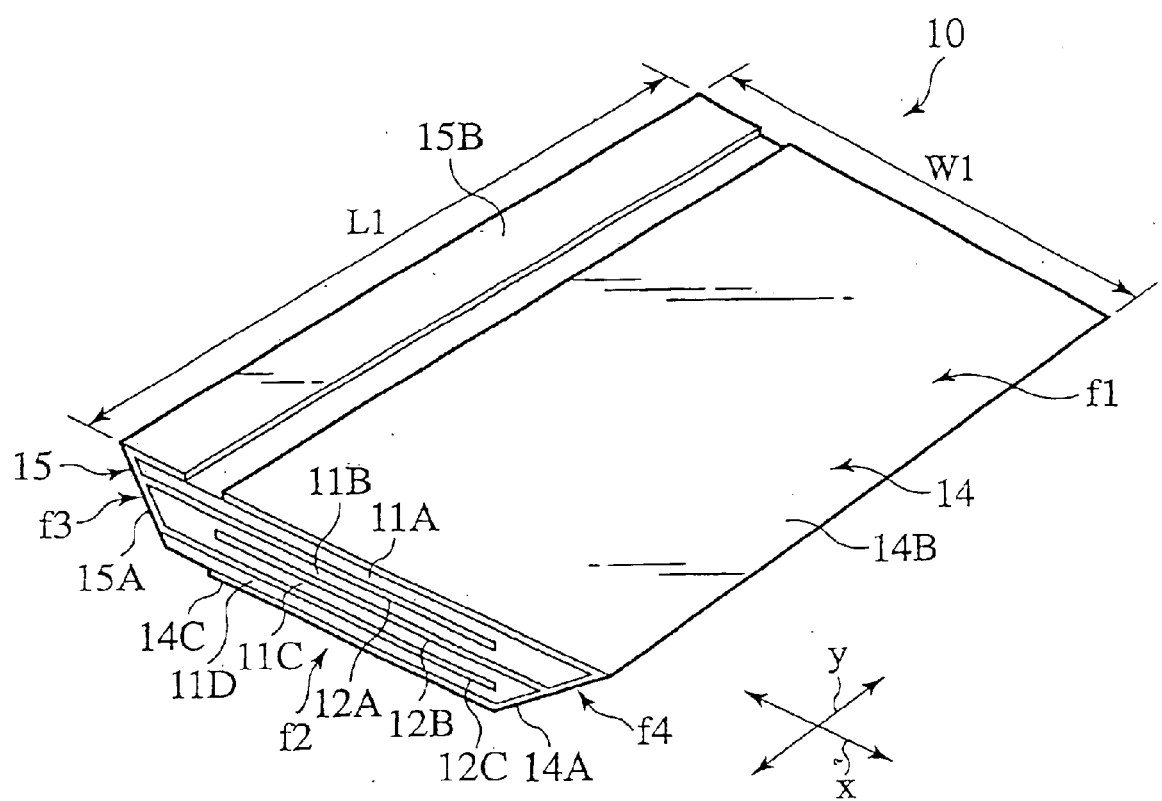
FIG. 1 is a perspective view which shows a piezoelectric/electrostrictive element according to the first embodiment of the invention.

A piezoelectric/electrostrictive element, a piezoelectric/electrostrictive device, and a production method thereof will be explained in detail with reference to embodiments as illustrated in the drawings. The attention should be paid to the fact that the drawings are schematic, and the thickness and a film thickness ratio of material layers are different from those in actual use. Practical thickness or dimensions should be decided with reference to the following explanation. Of course, parts whose dimensional relation and ratio are different from one another are included in the several drawings.

The piezoelectric/electrostrictive element and the piezoelectric/electrostrictive device according to the invention includes an element which converts electric energy into mechanical energy, or vice versa by the reverse piezoelectric effect or the electrostrictive effect, or the piezoelectric effect and a device equipped with the same. The piezoelectric/electrostrictive device of the present invention may be employed as passive elements such as acceleration sensors or impact sensors utilizing the piezoelectric effect, as well as active elements such as a variety of actuators or transducers, especially displacement elements using displacement by the reverse piezoelectric effect or the electrostrictive effect.

FIRST EMBODIMENT OF THE INVENTION
Piezoelectric/Electrostrictive Element

First, an outline of a structure of a piezoelectric/electrostrictive element of this embodiment will be described using FIGS. 1 to 4. The piezoelectric/electrostrictive element 10 of this embodiment, as shown in FIG. 1, includes, for example, four piezoelectric/electrostrictive layers 11A, 11B, 11C, and 11D, for example, three internal electrode layers 12A, 12B, and 12C interposed between an adjacent two of the piezoelectric/electrostrictive layers 11A, 11B, 11C, and 11D. A pair of external electrode layers 14 and 15 connect the internal electrode layers 12A, 12B, and 12C in an alternate manner alternately. The piezoelectric/electrostrictive element 10 has a substantially trapezoidal laminated structure in which upper and lower opposed bottom surfaces are both rectangular.

Figure 2:
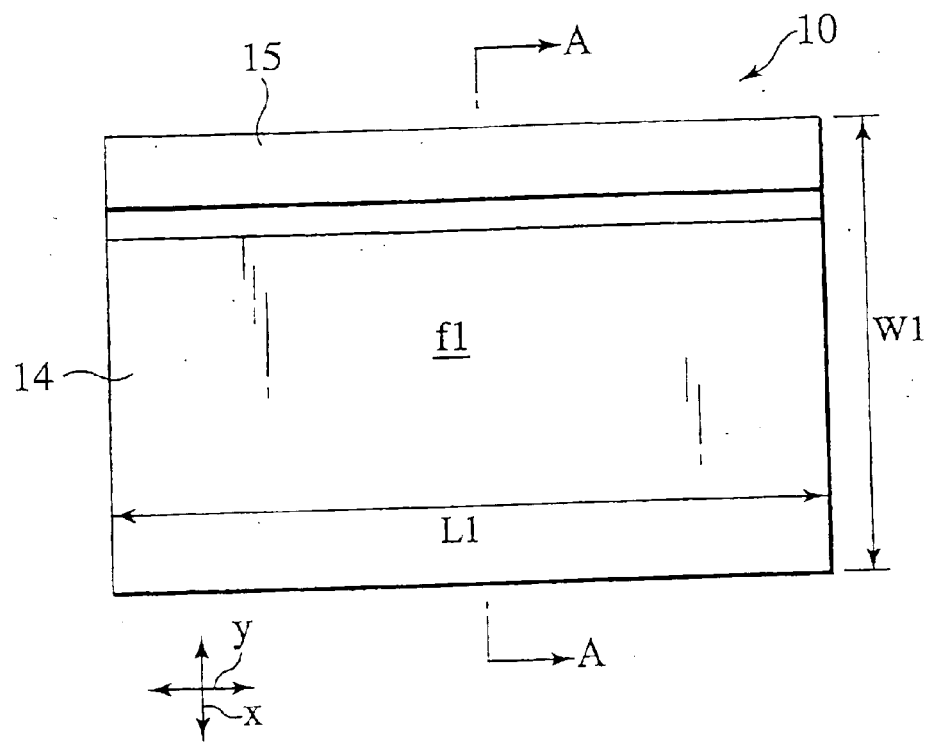
FIG. 2 is a plan view of a piezoelectric/electrostrictive element according to the first embodiment of the invention.
Figure 3:
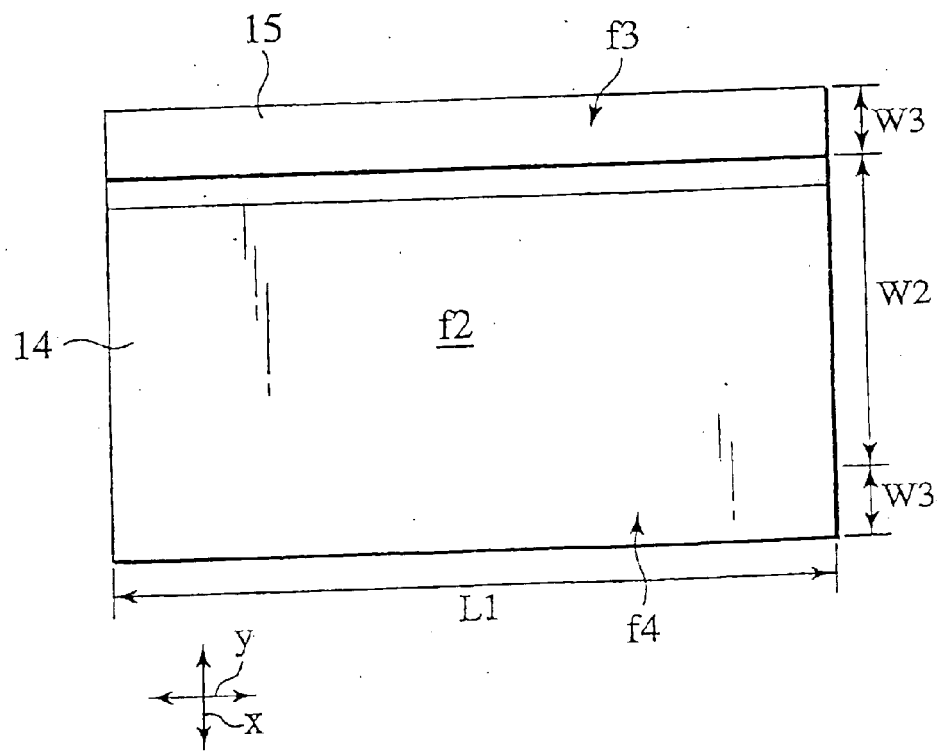
FIG. 3 is a bottom view of a piezoelectric/electrostrictive element according to the first embodiment of the invention.

As shown in FIG. 1, an area of one of the bottom surfaces (upper surface) f1 of the piezoelectric/electrostrictive element 10 is wider than that of the other bottom surface (lower surface) f2. As shown in FIG. 1, the width of the wider bottom surface f1 (i.e., the length in an arrow direction as expressed by x in the drawing) is W1, and the length thereof (i.e., the length in an arrow direction as expressed by y in the drawing) is L1. FIG. 2 is a plan view which shows the wider bottom surface f1. FIG. 3 is a bottom illustration of the piezoelectric/electrostrictive element 10 as viewed from the narrower bottom surface f2. As shown in FIG. 3, the width of the bottom surface f2 is W2, which is smaller than the width W1 of the bottom surface f1. The length of the bottom surface f2 is equal to the length L1 of the bottom surface f1.

As can be seen from the bottom illustration of the piezoelectric/electrostrictive element in FIG. 3, both side edges of the bottom surface f2 are located inward from both side edges of the bottom surface f1 by the same distance W3 and overlap with the bottom surface f1 in a lengthwise direction. The piezoelectric/electrostrictive element 10, thus, has slant surfaces f3 and f4, as shown in FIGS. 1 and 3, formed on the sides thereof in the direction x. The pair of slant surfaces f3 and f4 are inclined in a direction in which they approach each other from the wider bottom surface f1 to the narrower bottom surface f2.

Figure 4:
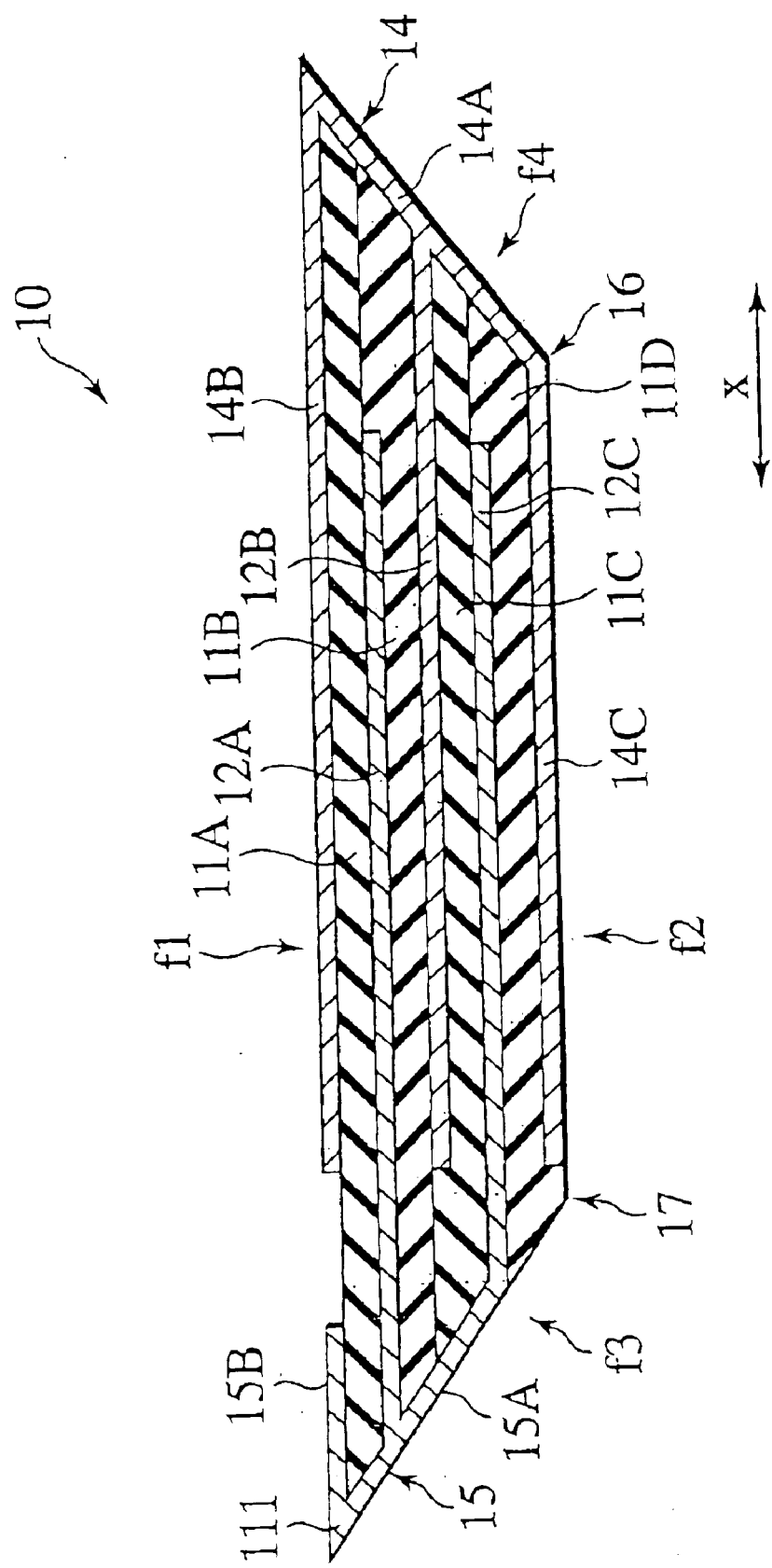
FIG. 4 is a cross-sectional elevation on section line A—A of FIG. 2.

The external structure of the piezoelectric/electrostrictive element 10 has been explained above. Next, the structure and positional relation of parts making up the piezoelectric/electrostrictive element 10 will be explained in detail using FIGS. 1 to 4. FIG. 4 is a cross-sectional view taken along section line A—A shown in FIG. 2.

In the piezoelectric/electrostrictive element 10 according to this embodiment, the piezoelectric/electrostrictive layers 11A, 11B, 11C, and 11D are made of, for example, lead zirconium titanate (PZT). When formed by PZT, the strength of the piezoelectric/electrostrictive layers 11A, 11B, 11C, and 11D is on the order of 70 MPa. The internal electrode layers 12A, 12B, and 12C and the external electrode layers 14 and 15 are made of, for example, platinum (Pt).

In the piezoelectric/electrostrictive element 10, the piezoelectric/electrostrictive layers 11A, 11B, 11C, and 11D which are laminated from the bottom surface f1 to the bottom surface f2 decrease in width gradually, so that the whole of the piezoelectric/electrostrictive element 10 has, as mentioned above, the slant surfaces f3 and f4 formed on the side portions.

Between the piezoelectric/electrostrictive layers 11A and 11B, the internal electrode layer 12A is disposed which extends from the slant surface f3 toward the slant surface f4. The internal electrode 12A does not contact the slant surface f4. Between the piezoelectric/electrostrictive layers 11B and 11C, the internal electrode layer 12B is disposed which extends from the slant surface f4 toward the slant surface f3. The internal electrode 12B does not contact the slant surface f3. Between the piezoelectric/electrostrictive layers 11C and 11D, the internal electrode layer 12C is disposed which extends, like the above described internal electrode layer 12A, from the slant surface f3 toward the slant surface f4, and does not contact the slant surface f4. It is advisable that the end edges of the above described internal electrodes 12A and 12C on the side of the slant surface f3 lie at the same location as viewed on a plane and overlap vertically, however, the internal electrode layer 12C may be shorter in the x direction extending from the slant surface f3.

Further, slant portions 14A and 15A of the external electrode layers 14 and 15 are formed on the slant surfaces f3 and f4. In this embodiment, the width of the slant portion 14A (i.e., the length in a direction of slant surface inclination) is greater than that of the slant portion 15A. The slant portion 14A is, as shown in FIG. 4, so formed as to cover the whole of the slant surface f4, thereby establishing connection of the slant portion 14A of the external electrode layer 14 to the internal electrode layer 12B. The slant surface portion 15A is formed to establish a connection of the slant portion 15A of the external electrode layer 15 to the internal electrode layers 12A and 12C. Specifically, the external electrode layers 15 and 14 are so constructed as to connect with the internal electrode layers 12A, 12B, and 12C alternately.

On an upper surface (i.e., an outer surface) of the widest piezoelectric/electrostrictive layer 11A, upper surface portions 14B and 15B of the external electrode layers 14 and 15 are, as shown in FIGS. 1 and 4, formed which extend from x-direction side edges of the outer surface of the piezoelectric/electrostrictive layer 11A so as to approach one another. The upper surface portions 14B and 15B of the external electrode layers 14 and 15 are separate from one another on the side of one of the edge portions of the piezoelectric/electrostrictive element 10. Specifically, in this embodiment, the width (i.e., the length in the x direction) of the upper surface portion 14B of the external electrode layer 14 is greater than the width of the external electrode layer 15. The edge of the upper surface portion 14B of the external electrode layer 14 on the side of the slant surface f3 lies at the same location as that of the edge of the above described internal electrode layer 12B as viewed on a plane, but however, it is not limited to this location.

On a lower surface (i.e., an outer surface) of the narrowest piezoelectric/electrostrictive layer 11D, the lower surface portion 14C of the external electrode layer 14 is formed. The lower surface portion 14C extends from a lower edge of the slant surface 14A toward the slant surface f3. An edge of the lower surface portion 14C on the side of the slant surface f3 is set to lie at the same location as that of an edge of the internal electrode layer 12B as viewed on a plane, however, it is not limited to this location.

In this embodiment, the piezoelectric/electrostrictive layers 11A, 11B, 11C, and 11D are four layers. The internal electrode layers 12A, 12B, and 12C are three layers. The upper surface portion 14B and the lower surface portion 14C of the external electrode layer 14 are so arranged on the upper and lower surfaces of the piezoelectric/electrostrictive element 10 as to function as opposed electrodes, however, the number of the layers and the number of the internal electrode layers connecting with the external electrode layers 14 and 15, respectively, may be equal to or unequal number with respect to one another. The number of the electrode layers are determined in terms of relations to a drive voltage and the degree of displacement of a movable plate, as will be described later. An increase in total number of the piezoelectric/electrostrictive layers will cause a driving force driving the movable plate on which the piezoelectric/electrostrictive element 10 is installed to be increased, thus enabling a greater displacement and result in an increase in rigidity of the piezoelectric/electrostrictive element 10, thereby increasing the resonance frequency, which allows the speed of a displacement operation to be increased easily.

As a practical material of the piezoelectric/electrostrictive layers 11A, 11B, 11C, and 11D in this embodiment, ceramic may be used which contains one or a mixture of lead zirconate, lead titanate, lead magnesium-niobate, lead nickel niobate, lead zinc niobate, lead manganese niobate, lead antimony stannate, lead manganese tungstate, lead cobalt niobate, barium titanate, sodium bismuth titanate, kalium sodium niobate, and strontium bismuth tantalate in addition to the above described lead zirconium titanate (PZT).

Particularly, material whose main components are lead zirconate, lead titanate, and lead magnesium niobate or material whose main component is sodium bismuth titanate have high electromechanical coupling factor and piezoelectric constant, are low in reactivity to a firing setter (in this case, ceramic oxide such as zirconia, alumina, or magnesia), and provide stable compositions when the piezoelectric/electrostrictive layers 11A, 11B, 11C, and 11D).

Further, one or some of oxides such as lanthanum (La), calcium (Ca), strontium (Sr), molybdenum (Mo), tungsten (W), barium (Ba), niobium (Nb), zinc (Zn), nickel (Ni), manganese (Mn), cerium (Ce), cadmium (Cd), chromium (Cr), cobalt (Co), antimony (Sb), iron (Fe), yttrium (Y), tantalum (Ta), lithium (Li), bismuth (Bi), and tin (Sn) may be mixed with the above described ceramic material.

Additionally, for example, lanthanum (La) and strontium (Sr) may be added to main components of lead zirconate, lead titanate, and lead magnesium niobate for providing the advantage that it is possible to adjust the coercive electric field and piezoelectric characteristics.

The addition of an easy-to-vitrify material such as silica is preferably avoided. The reason for this is that material such as silica reacts easily with a piezoelectric/electrostrictive material during heat treatment (i.e., firing) of the piezoelectric/electrostrictive layers 11A, 11B, 11C, and 11D and change components thereof, thus resulting in the deterioration of piezoelectric characteristics.

As the piezoelectric/electrostrictive layers 11A, 11B, 11C, and 11D, the above described variety of piezoelectric ceramics are preferably used, but electrostrictive ceramics, ferroelectric ceramics or antiferroelectric ceramics may be employed. However, in a case where the piezoelectric/electrostrictive element 10 is used to position a magnetic head of a hard disc drive, the linearity to the amount of displacement of moving parts, a drive voltage, or an output voltage is important. The use of material that is smaller in electric-field strain hysteresis is, thus, preferable. Specifically, material having a coercive electric field of 10 kV/mm or less is preferably used.

The external electrode layers 14 and 15 are preferably made of metal which is solid at room temperature and excellent in conductivity. As such a metal, in addition to the above described platinum (Pt), one of aluminum (Al), titanium (Ti), chromium (Cr), iron (Fe), cobalt (Co), nickel (Ni), copper (Cu), zinc (Zn), niobium (Nb), molybdenum (Mo), ruthenium (Ru), palladium (Pd), rhodium (Rh), silver (Ag), tin (Sn), tantalum (Ta), tungsten (W), iridium (Ir), gold (Au), and lead (Pb) or an alloy thereof may be used. A cermet material in which the same material as that of the piezoelectric/electrostrictive layers 11A, 11B, 11C, and 11D is dispersed in the above materials may be used.

The selection of materials of the external electrode layers 14 and 15 and the internal electrode layers 12A, 12B, and 12C of the piezoelectric/electrostrictive element 10 is determined depending upon a method of forming the piezoelectric/electrostrictive layers 11A, 11B, 11C, and 11D. The method of forming the piezoelectric/electrostrictive layers will be described later.

In the thus constructed piezoelectric/electrostrictive element 10, corners (ridge portions) 16 and 17 of both widthwise sides of the lower surface f2, as shown in FIG. 4, have obtuse angles. Specifically, the angles which the lower surface f2 makes with the slant surfaces f3 and f4 are obtuse, so that the corners 16 and 17 have a greater strength as compared with corners having right angles or acute angles. The increase in strength of the corners 16 and 17 serves to avoid the damage or breakage of the corners 16 and 17 caused by an external force or vibrations of the piezoelectric/electrostrictive element 10 when the lower surface f2 of the piezoelectric/electrostrictive element 10 is installed on a movable plate (i.e., a diaphragm).

The upper surface portions 14B and 15B of the external electrode layers 14 and 15 are both disposed on the side of the wider bottom surface f1, thus allowing the upper surface portions 14B and 15B to be used as connection areas (i.e., pad portions), which facilitates connection of wires.

Piezoelectric/Electrostrictive Device

Figure 5:
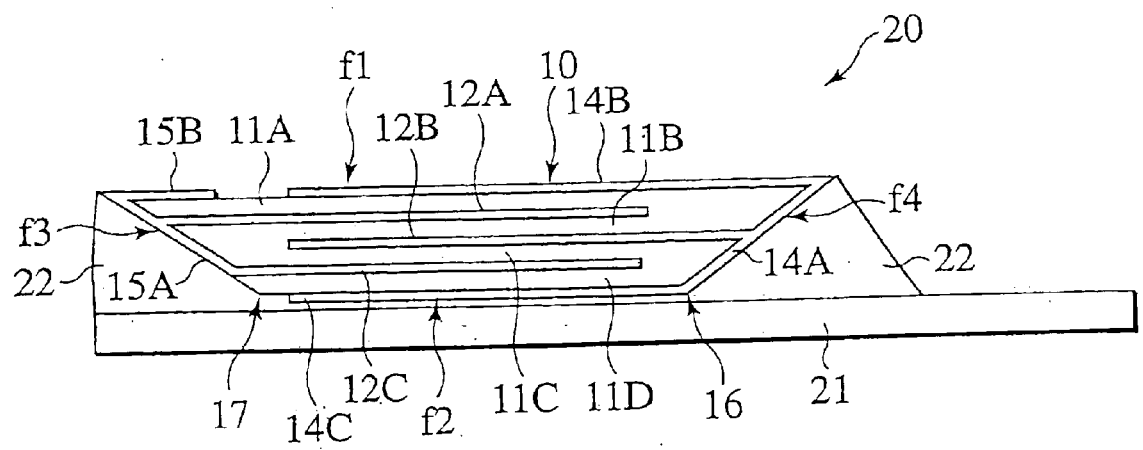
FIG. 5 is a side view of a piezoelectric/electrostrictive device according to the first embodiment of the invention.
Figure 6:
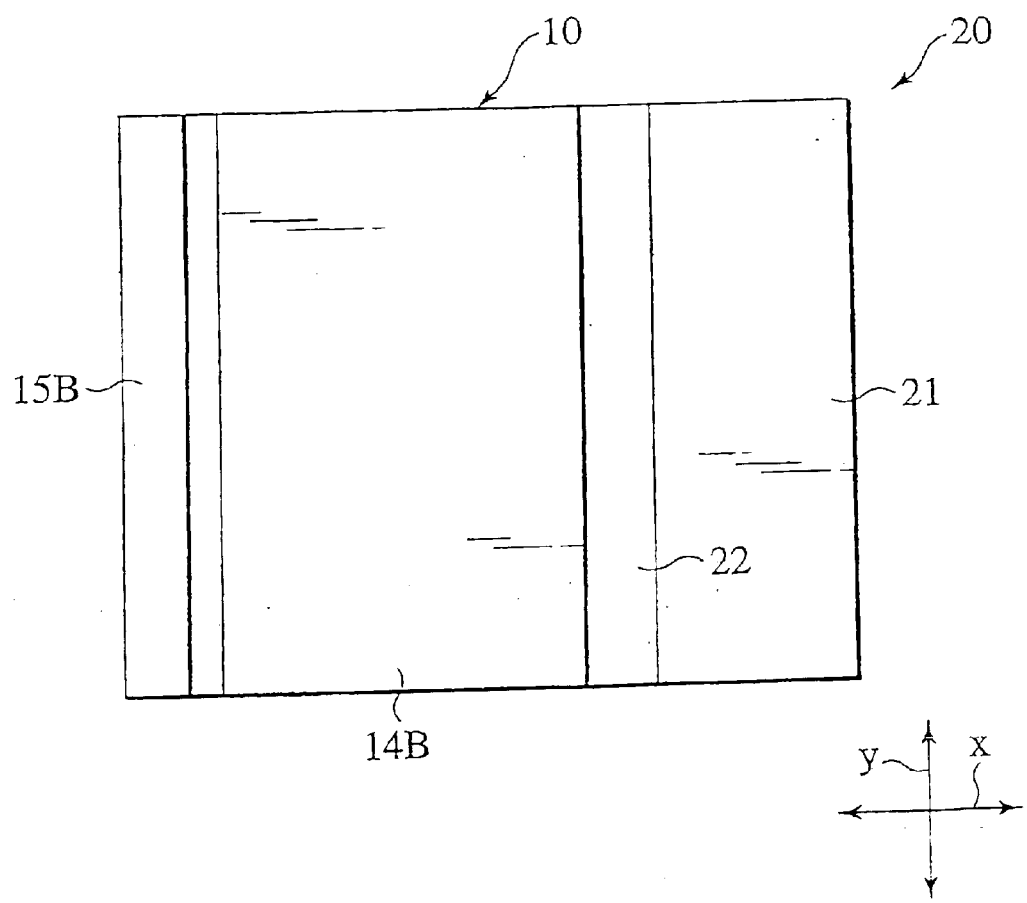
FIG. 6 is a plan view of a piezoelectric/electrostrictive device according to the first embodiment of the invention.
Figure 7:
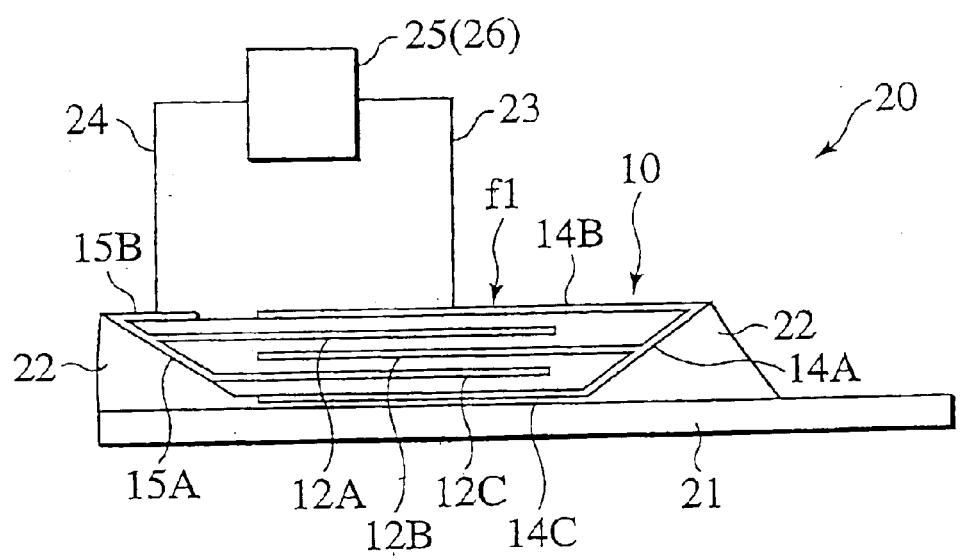
FIG. 7 is an explanatory side view which represents usage of a piezoelectric/electrostrictive device according to the first embodiment of the invention.

Next, an embodiment of a piezoelectric/electrostrictive device 20 employing the piezoelectric/electrostrictive element 10 according to the first embodiment will be described using FIGS. 5 to 7. FIG. 5 is a side view of the piezoelectric/electrostrictive device 20. FIG. 6 is a plan view of the piezoelectric/electrostrictive device 20.

The piezoelectric/electrostrictive device 20 is constructed to be of a unimorph type wherein the narrower lower surface f2 of the above described piezoelectric/electrostrictive element 10 is joined to a movable plate (diaphragm) 21 using adhesive 22. In the piezoelectric/electrostrictive device 20 according to this embodiment, the piezoelectric/electrostrictive element 10 is substantially identical in width (i.e., the length in ay direction, as expressed by an arrow in FIG. 6) with the movable plate 21. The length (i.e., the length in an x direction, as expressed by an arrow in FIG. 6) of the movable plate 21 is set longer than that of the piezoelectric/electrostrictive element 10. The movable plate 21 may have flexibility and mechanical strength which withstands breakage caused by bending. Material may be selected in terms of the response and operationability.

In the piezoelectric/electrostrictive device 20, the adhesive 22 is interposed between an upper surface of the movable plate 21 and a bottom surface (lower surface) and the slant surfaces f3 and f4 of the piezoelectric/electrostrictive element 10 to bond the piezoelectric/electrostrictive element 10 on the upper surface of the movable plate 21. Particularly, V groove-shaped gaps defined between the slant surfaces f3 and f4 of the piezoelectric/electrostrictive element 10 and the upper surface of the movable plate 21 are filled with the adhesive 22. As a result, the shape defined by the piezoelectric/electrostrictive element 10 and the adhesive 22 will be substantially trapezoidal or rectangular.

The movable plate 21 is a portion which operates based on driving of the piezoelectric/electrostrictive element 10 and has a variety of parts installed thereon according to the purpose of use of the piezoelectric/electrostrictive device 20. For instance, in a case where the piezoelectric/electrostrictive device 20 is used as a displacement element, a shielding plate of an optical shutter etc. is installed. In a case where the piezoelectric/electrostrictive device 20 is employed to position a magnetic head of a hard disc drive or in a ringing inhibiting mechanism, parts such as a magnetic head, a slider with the magnetic head, or a suspension with a slider which are required to be positioned are installed.

As material of the movable plate 21, ceramic including zirconia is preferable. Particularly, material containing a main component of stabilized zirconia or partially stabilized zirconia is desirable as the material of the movable plate 21 because it exhibits a greater mechanical strength and toughness if shaped to have a thin wall.

When the movable plate 21 is made of a metallic material, it is preferably flexible or bendable. For example, as ferrous materials, a variety of stainless steels or a variety of spring steels are desirable. As non-ferrous materials, beryllium copper, phosphor bronze, nickel, or nickel-iron alloy is desirable.

In the thus constructed piezoelectric/electrostrictive device 20, the V groove-shaped gaps defined by the slant surfaces f3 and f4 and the upper surface of the movable plate 21 are formed on both sides of the piezoelectric/electrostrictive element 10 and work as a liquid sumps for the adhesive 22 that is liquid or pastelike. The adhesive 22 held in the gaps is solidified while being kept lump by the surface tension, thereby preventing the adhesive 22 from overflowing to or around the upper side of the piezoelectric/electrostrictive element 10 or the lower side of the movable plate 21. The V groove-shaped gaps defined by the slant surfaces f3 and f4 of the piezoelectric/electrostrictive element 10 and the upper surface of the movable plate 21 may be filled with the adhesive 22 in proper quantities by determining the quantity of the adhesive 22 to be applied to the movable plate 21 to a predetermined value.

The side corners of the lower surface f2 of the piezoelectric/electrostrictive element 10 both have, as described above, obtuse angles, and thus have a greater strength as compared with when they have right angles or acute angles. The increase in strength of the corners 16 and 17 serves to avoid the damage or breakage of the corners 16 and 17 caused by vibrations of the piezoelectric/electrostrictive element 10 or external forces.

Further, the stress arising from a thermal expansion difference between the piezoelectric/electrostrictive element 10 and the movable plate 21 is maximized near the ends of the piezoelectric/electrostrictive element 10, but the adhesive 22 in the V groove-shaped gaps works to hold the adhesive strength and reduce the stress because of a low elasticity of the adhesive, thereby avoiding breakage and removal of the piezoelectric element 10 from the movable plate 21.

The upper surface portions 14B and 15B of the external electrode layers 14 and 15 are arranged on the side of the wider bottom surface f1 (i.e., on the same plane), thereby facilitating connection of wire to the upper surface portions 14B and 15B.

In a case where the thus constructed piezoelectric/electrostrictive device 20 is used as an active device, wires 23 and 24 may be connected to the upper surface portion 14B of the external electrode layer 14 and the upper surface portion 15B of the external electrode layer 15 formed on the bottom surface f1, respectively, and to a voltage applying circuit 25. Such an active device may be employed as transducers, actuators, frequency domain functional parts (filters), transformers, vibrators or resonators for communications or power sources, oscillators, or discriminators. The wires 23 and 24 are provided preferably by a flexible printed circuit (FPC), flexible flat cables (FFC), or bonding wires.

In a case where the piezoelectric/electrostrictive device 20 is used as a passive device, the wires 23 and 24 may be connected to a voltage detecting circuit 26 instead of the voltage applying circuit 25. In the case where the wires 23 and 24 are joined to the upper surface portions 14B and 15B of the external electrode layers 14 and 15 of the piezoelectric/electrostrictive element 10, it is advisable that the adhesive 22 have electric insulation ability. Such a passive device may be employed as ultrasonic sensors, acceleration sensors, angular rate sensors, shock sensors, or mass sensors.

Modified Embodiment 1 of Piezoelectric/Electrostrictive Device

Figure 8:
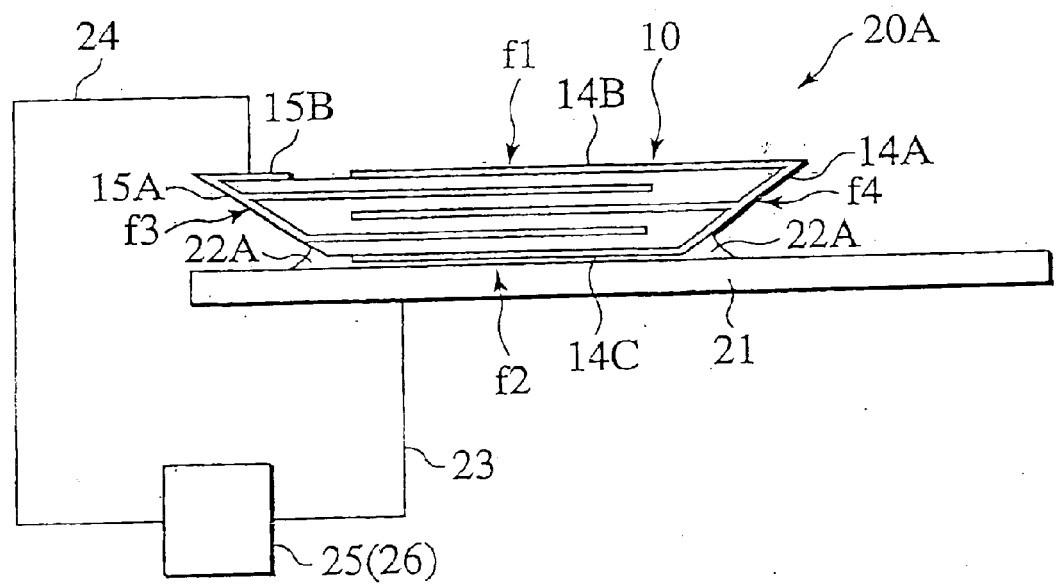
FIG. 8 is an explanatory side view which shows a modified embodiment 1 of a piezoelectric/electrostrictive device according to the first embodiment of the invention.

FIG. 8 is an explanatory side view which illustrates the modified embodiment 1 of the piezoelectric/electrostrictive device using the piezoelectric/electrostrictive element 10 according to the first embodiment. The structure of the modified embodiment 1 will be explained with the same reference numbers assigned to the same parts of the modified embodiment 1 as those of the above-described piezoelectric/electrostrictive device 20 and similar reference numbers assigned to similar parts thereof.

The piezoelectric/electrostrictive device 20A according to the modified embodiment 1 has the narrower bottom surface f2 of the above described piezoelectric/electrostrictive element 10 bonded and secured to the upper surface of the movable plate 21 having the conductivity using the adhesive 22 having the conductivity.

In the modified embodiment 1, the lower surface portion 14C and a lower portion of the slant surface 14A of the external electrode layer 14 formed on the bottom surface f2 of the piezoelectric/electrostrictive element 10 are joined to and secured on the movable plate 21 through the adhesive 22A. The adhesive 22A is set so as not to extend over the slant surface 15A of the external electrode layer 15. This is achieved by determining the quantity of the adhesive 22A to be applied to the movable plate 21 properly.

In the thus constructed piezoelectric/electrostrictive device 20A, the wire 23 is joined to the movable plate 21, and the wire 24 is coupled to the upper surface portion 15B of the external electrode layer 15. The use of the piezoelectric/electrostrictive device 20A as an active device may be achieved by connecting the wires 23 and 24, as shown in FIG. 8, to the voltage applying circuit 25. The use of the piezoelectric/electrostrictive device 20A as a passive device may be achieved by connecting the wires 23 and 24, as shown in FIG. 8, to the voltage detecting circuit 26.

As the adhesive 22 having the conductivity, a variety of conductive bonds including metallic fillers or anisotropic conductive bonds used in the field of semiconductor packaging may be selected properly.

The movable plate 21 having the conductivity may be made of a metallic material that is flexible or bendable. For example, as ferrous materials, a variety of stainless steels or a variety of spring steels are desirable. As non-ferrous materials, beryllium copper, phosphor bronze, nickel, or nickel-iron alloy is desirable.

Modified Embodiment 2 of Piezoelectric/Electrostrictive Device

Figure 9:
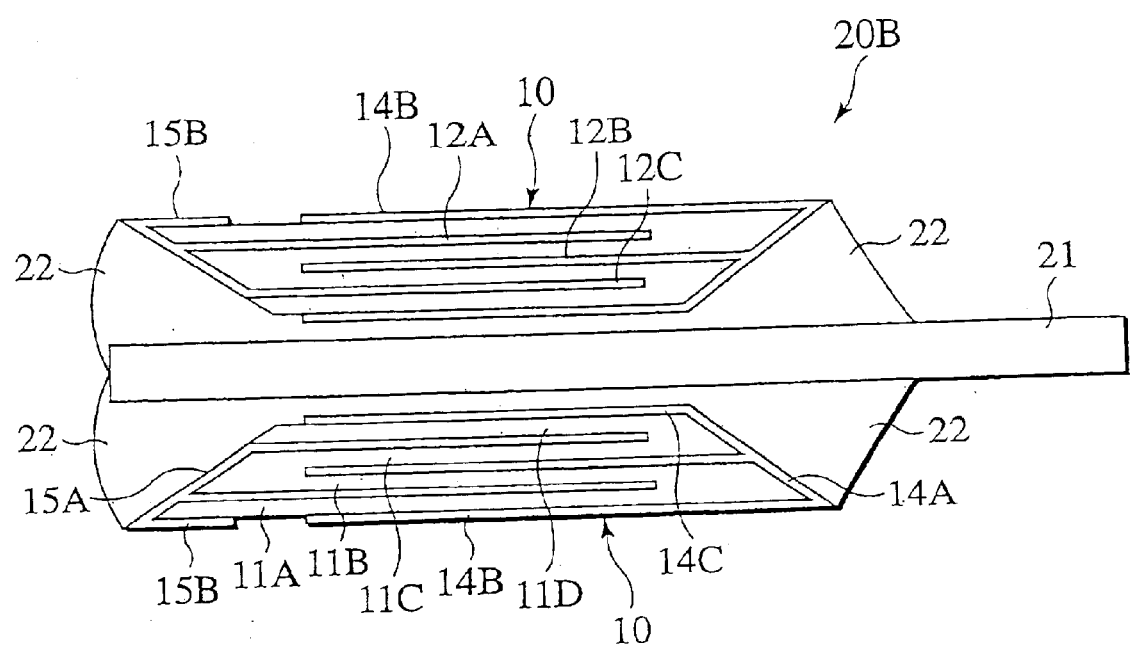
FIG. 9 is an explanatory side view which shows a modified embodiment 2 of a piezoelectric/electrostrictive device according to the first embodiment of the invention.

FIG. 9 is a side view which illustrates the modified embodiment 2 of the piezoelectric/electrostrictive device using the piezoelectric/electrostrictive elements 10 according to the first embodiment. The structure of the modified embodiment 2 will be explained with the same reference numbers assigned to the same parts of the modified embodiment 2 as those of the above described piezoelectric/electrostrictive device 20 and similar reference numbers assigned to similar parts thereof.

The piezoelectric/electrostrictive device 20B according to the modified embodiment 2 has a bimorph type structure in which the above constructed piezoelectric/electrostrictive element 10 is secured on each surface of the single movable plate 21 by the adhesive 22. The narrower bottom surfaces f2 of the piezoelectric/electrostrictive elements 10 are placed in contact with the respective surfaces of the movable plate 21 and bonded so that the movable plate 21 is sandwiched therebetween.

In the piezoelectric/electrostrictive device 20B according to the modified embodiment 2, wires may be connected to the upper surface portions 14B and 15B of the external electrode layers 14 and 15 of each of the piezoelectric/electrostrictive elements 10. Alternatively, the movable plate 21 may be used as a common electrode of the piezoelectric/electrostrictive elements 10, and a wire may be connected only to the upper surface portion 15B of each of the piezoelectric/electrostrictive element 10.

The assembly of the piezoelectric/electrostrictive elements 10 may be of a symmetrical type (a series type) in which the directions of polarization are symmetrical with respect to the movable plate 21 or an asymmetrical type (a parallel type) in which the directions of polarization of the piezoelectric/electrostrictive elements 10 are the same.

Modified Embodiment 3 of Piezoelectric/Electrostrictive Device

Figure 10:
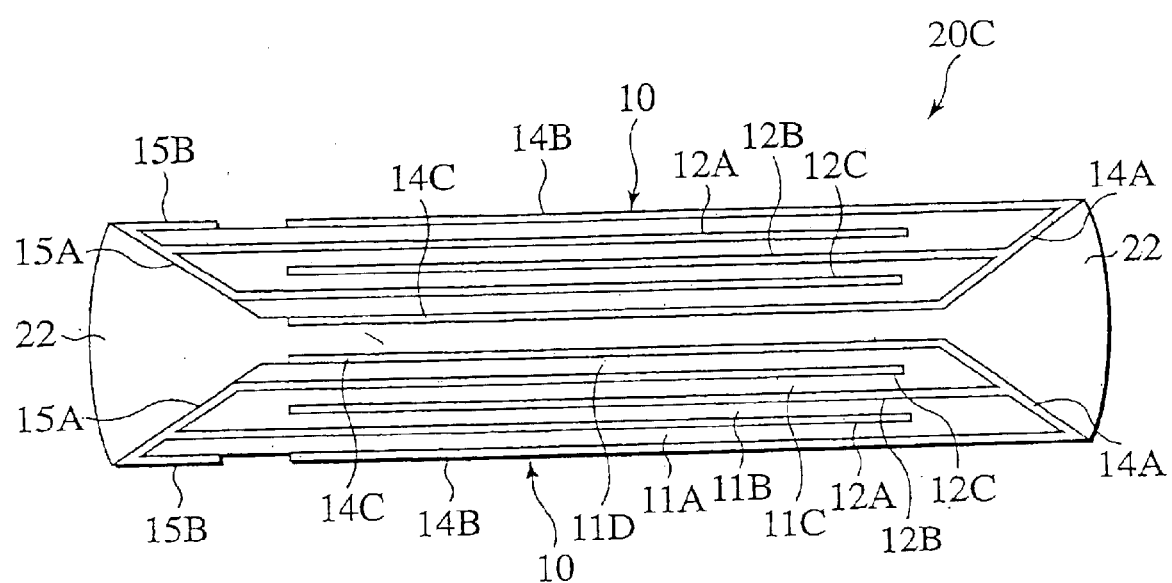
FIG. 10 is an explanatory side view which shows a modified embodiment 3 of a piezoelectric/electrostrictive device according to the first embodiment of the invention.

FIG. 10 is a side view which illustrates the modified embodiment 3 of the piezoelectric/electrostrictive device using the piezoelectric/electrostrictive elements 10 according to the first embodiment. The structure of the modified embodiment 2 will be explained using the same reference numbers assigned to the same parts as those of the above described piezoelectric/electrostrictive device 20 and similar reference numbers assigned to similar parts.

In the piezoelectric/electrostrictive device 20C according to the modified embodiment 3, a pair of piezoelectric/electrostrictive elements 10 are so arranged that the narrower bottom surfaces f2 thereof are opposed to each other and bonded to each other through the adhesive 22. The piezoelectric/electrostrictive device 20C has a bimorph type structure which is not equipped with a movable plate.

In the modified embodiment 3, the assembly of the piezoelectric/electrostrictive elements 10, like the above described modified embodiment 2, may be of the symmetrical type (the series type) or the asymmetrical type (the parallel type).

Modified Embodiment 4 of Piezoelectric/Electrostrictive Device

Figure 11:
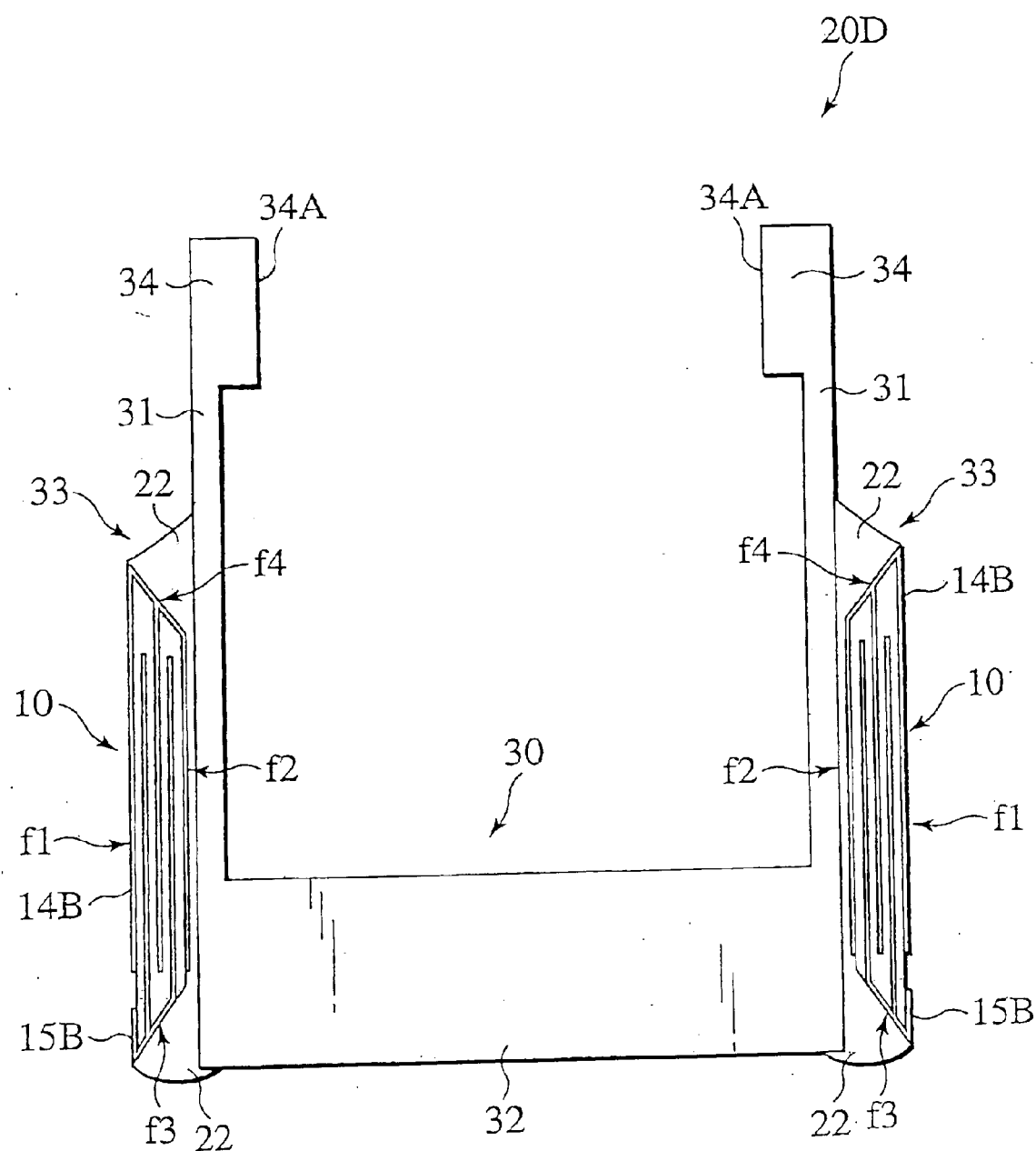
FIG. 11 is an explanatory side view which shows a modified embodiment 4 of a piezoelectric/electrostrictive device according to the first embodiment of the invention.

FIG. 11 is a side view which illustrates the modified embodiment 4 of the piezoelectric/electrostrictive device using the piezoelectric/electrostrictive elements 10 according to the first embodiment.

The piezoelectric/electrostrictive device 20D according to the modified embodiment 4, as shown in FIG. 11, includes a base body 30 which has movable plate portions 31 and a fixing portion 32 formed integrally. The movable plate portions 31 are opposed to each with through a given gap. The fixing portion 32 is interposed between the movable plate portions 31 on the same side of ends of the movable plate portions 31. The piezoelectric/electrostrictive device 20D has the piezoelectric/electrostrictive elements 10 bonded and secured to opposed outside surfaces on the same side of end portions of the pair of movable plate portions 31.

The piezoelectric/electrostrictive device 20D has the structure in which the movable plate portions 31 are displaced by driving the piezoelectric/electrostrictive elements 10, or the displacement of the movable plate portions 31 is detected by the piezoelectric/electrostrictive elements 10. For instance, in the piezoelectric/electrostrictive device 20D shown in FIG. 11, the movable plate portions 31 and the piezoelectric/electrostrictive elements 10 constitute actuator portions 33. On the other ends of the movable plate portions 31, movable portions 34 are formed which are so formed as to have thick walls projecting inwardly. The movable portions 34 are displaced following displacing operations of the movable plate portions 31.

The base body 30 may be made of metal or ceramic as a whole or have a hybrid structure made of a combination of metal and ceramic. The base body 30 may also have a structure in which respective parts are bonded by adhesive such as organic resin or glass, a ceramic one-piece structure made of a fired ceramic green laminate, or a metallic one-piece structure formed integrally by brazing, soldering, eutectic bonding, or welding. It is advisable that the base body 30 be made of a ceramic laminate formed integrally by firing a ceramic green laminate. Such ceramic one-piece members are of a structure which has high reliability of joints and is excellent in ensuring the rigidity and easy to manufacture.

The piezoelectric/electrostrictive elements 10 are bonded and secured to outside surfaces on the same side of the end portions of the base body 30 through the adhesive 22. The adhesive 22 may be an organic adhesive or inorganic adhesive. The piezoelectric/electrostrictive elements 10 are bonded at the narrower bottom surfaces f2 to the base body 30. The V groove-shaped gaps defined by the slant surfaces f3 and f4 of the piezoelectric/electrostrictive elements 10 and the external surfaces of the base body 30 are filled with the adhesive 22. As a result, the shape defined by the piezoelectric/electrostrictive elements 10 and the adhesive 22 will be substantially trapezoidal or rectangular parallelepipedic.

On the wider bottom surfaces f1 of the piezoelectric/electrostrictive elements 10, the upper surface portions 14B of the external electrode layers 14 and the upper surface portions 15B of the external electrode layers 15 are disposed away from each other while keeping electric insulation. A wire is, thus, bonded to the upper surface portions 14B and 15B which is to be joined to a voltage applying circuit or a voltage detecting circuit which is not shown.

A gap (air), as shown in FIG. 11, may be defined between the opposed end surfaces 34A of the pair of movable portions 34. Alternatively, a plurality of members made of material identical with or different from that of the movable portions 34 may be disposed between the opposed end surfaces 34A.

In the thus constructed piezoelectric/electrostrictive device 20D, the movable portions 34, the movable plate portions 31, and the fixing portion 32 that define the basic structure are formed integrally by a tough material. The piezoelectric/electrostrictive device 20D, therefore, has the advantages that it is higher in mechanical strength, excellent in handling, impact resistance, and moisture resistance, and less susceptible to harmful vibrations (e.g., residual vibrations or noise during high-speed operation) as compared with a piezoelectric/electrostrictive device in which all parts are made of a piezoelectric/electrostrictive material that is fragile and relatively heavy.

The formation of the gap between the opposed end surfaces 34A of the movable portions 34 of the piezoelectric/electrostrictive device 20D provides the flexibility of the movable portion 34 including one of the end surfaces 34A and the movable portion 34 including the other end surface 34A, so that a deformation limit to which the piezoelectric/electrostrictive device is not broken will be high. The piezoelectric/electrostrictive device 20D, therefore, has the advantage that it is excellent in handling.

In the piezoelectric/electrostrictive device 20D, the movable portions 34 are portions which operate, as described above, based on the amount of displacement of the movable plate portions 31 and have a variety of parts installed thereon according to the purpose of use of the piezoelectric/electrostrictive device 20D. For instance, in a case where the piezoelectric/electrostrictive device 20D is used as a displacement element, for example, a shielding plate of an optical shutter is installed. In a case where the piezoelectric/electrostrictive device 20D is employed to position a magnetic head of a hard disc drive or in a ringing inhibiting mechanism, parts requiring positioning of the magnetic head, a slider with the magnetic head, or a suspension with a slider are installed.

The fixing portion 32 is, as described above, a portion supporting the movable plate portions 31 and the movable portions 34. For instance, in a case of use in positioning a magnetic head of a hard disc drive, the fixing portion 32 may be installed on a carriage arm mounted on a voice coil motor (VCM), a mount plate attached to the carriage arm, or a suspension to fix the whole of the piezoelectric/electrostrictive device 20D.

Further, in this modified embodiment, the movable plate portions 31 are portions driven by the displacement of the piezoelectric/electrostrictive elements 10 and thus are thin plate like members having the flexibility and work to perform a function of amplifying as a bending displacement an expansion/contraction displacement of the piezoelectric/electrostrictive elements 10 disposed on the surface thereof to transfer it to the movable portions 34. Therefore, the shape and material of the movable plate portions 31 which only exhibit the flexibility and mechanical strength less susceptible to breakage caused by the bending displacement may be selected properly in terms of response and operationability of the movable portions 34.

The movable plates 31 are preferably made of ceramics including zirconia. Of the ceramics, material containing a main component of stabilized zirconia and material containing a main component of partially stabilized zirconia are desirable in terms of a greater mechanical strength and a higher toughness even though a wall thickness is small.

If the movable plate 31 is made of a metallic material, it is preferably flexible or bendable. For example, as ferrous materials, a variety of stainless steels or a variety of spring steels are desirable. As non-ferrous materials, beryllium copper, phosphor bronze, nickel, or nickel-iron alloy is desirable.

As the above described stabilized and partially stabilized zirconia, the following stabilized or partially stabilized ones are preferable. Specifically, as compounds stabilizing or partially stabilizing zirconia, there are yttrium oxide, ytteribium oxide, cerium oxide, calcium oxide, and magnesium oxide. The desired stabilization of zirconia may be achieved by adding at least one of the above compounds or a mixture thereof to the zirconia.

Added amounts of yttrium oxide and ytteribium oxide are 1 to 30 mol %, preferably 1.5 to 10 mol %. An added amount of cerium oxide is 6 to 50 mol %, preferably 8 to 20 mol %. Added amounts of calcium oxide and magnesium oxide is 5 to 40 mol %, preferably 5 to 20 mol %. Of these, yttrium oxide is preferably used as a stabilizer. In the case where yttrium oxide is used as a stabilizer, the amount thereof is preferably 1.5 to 10 mol % and more preferably 2 to 4 mol %.

In order to obtain the mechanical strength and stabilized crystal phase, the mean crystal grain size is 0.05 to 3 $\mu$m, preferably 1 $\mu$m or less. As described above, the movable plate portion 31, like the movable portion 34 and the fixing portion 32, may be made of ceramic. The use of substantially the same material is advantageous to improve the reliability of joints and the strength of the piezoelectric/electrostrictive device 20D and alleviate the complexity of manufacture.

Production Method of Piezoelectric/Electrostrictive Element of the First Embodiment Next, a production method of the piezoelectric/electrostrictive element 10 according to the first embodiment will be described below using FIGS. 12 to 24. The production method will be discussed while comparing and associating new reference numbers of respective material layers with reference numbers of the piezoelectric/electrostrictive element 10 that is a finished product as shown in FIGS. 1 to 4. The method includes the following steps 1–12.

Figure 12:
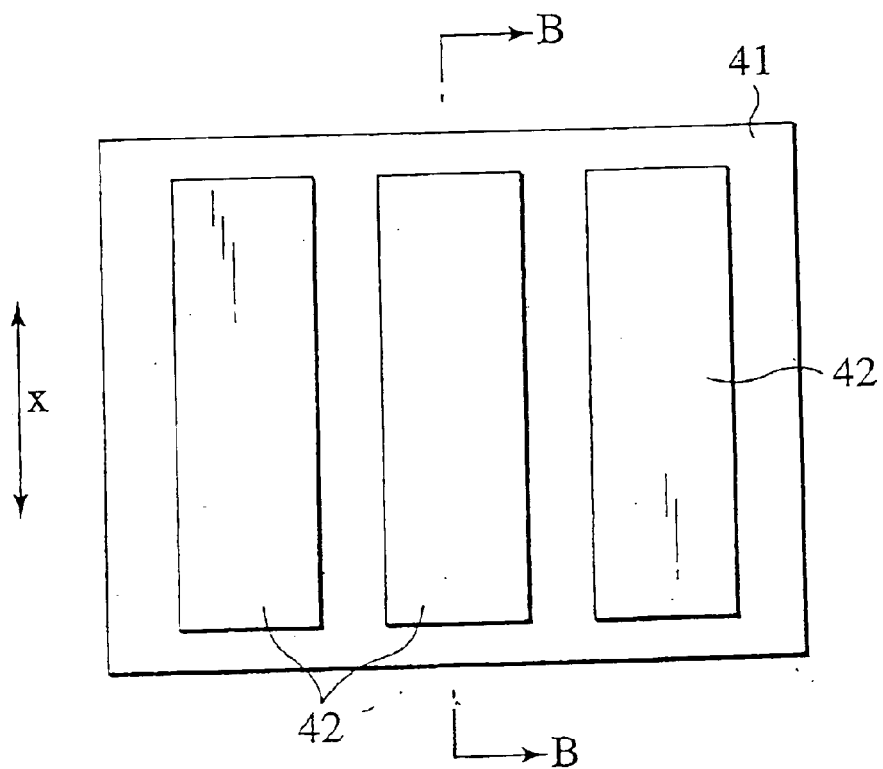
FIG. 12 is a plan view which illustrates a production method of a piezoelectric/electrostrictive element according to the first embodiment of the invention.

(1) First, a ceramic substrate 41, as shown in FIG. 12, is prepared which has a give size and is made of oxide such as zirconia, alumina, or magnesia. The ceramic substrate 41 functions as a table for screen printing and a firing substrate.

Incidentally, the ceramic substrate 41 measures approximately 40 mm×50 mm×0.3 mm.

Figure 13:
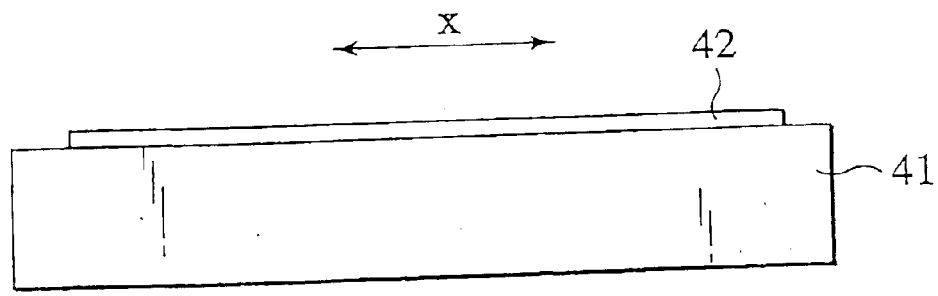
FIG. 13 is a side view which illustrates a production method of a piezoelectric/electrostrictive element according to the first embodiment of the invention.

(2) Carbon powder or a theobromine powder-dispersed paste is printed using a 360 mesh metal screen having an emulsion film thickness of 10 μm on a row of areas on the ceramic substrate 41 which have a width greater than that of the piezoelectric/electrostrictive element 10 and then dried to form, as shown in FIG. 12, a row of disappearing films 42. Each of the disappearing films 42 contains a plurality of element-forming areas in an x direction. FIG. 13 is a cross section on section line B—B of FIG. 12. The disappearing films 42 will disappear by firing in a subsequent process to perform the function of facilitating removal of the piezoelectric/electrostrictive elements 10 from the ceramic substrate 41. A printing direction of the disappearing films 42 is a direction as illustrated by an arrow x in FIG. 12.

Figure 14:
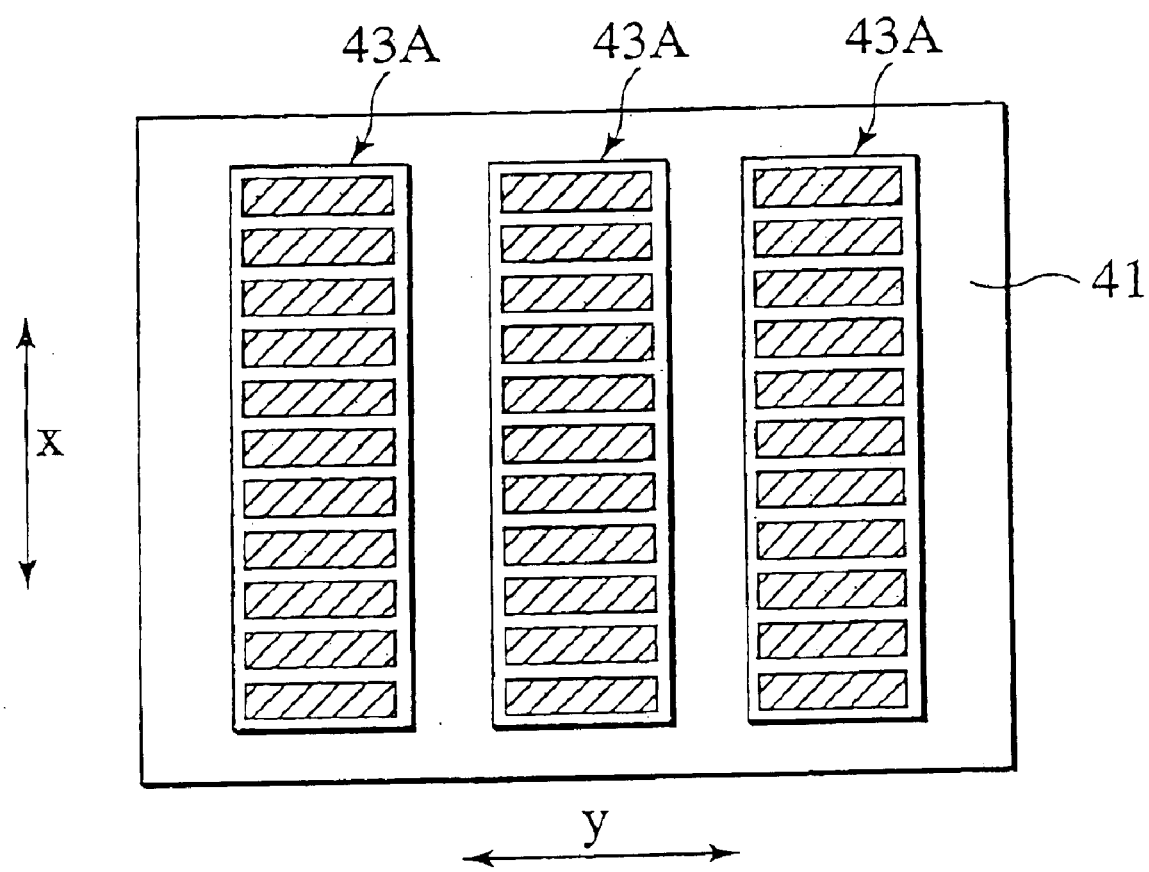
FIG. 14 is a plan view which illustrates a production method of a piezoelectric/electrostrictive element according to the first embodiment of the invention.
Figure 15:
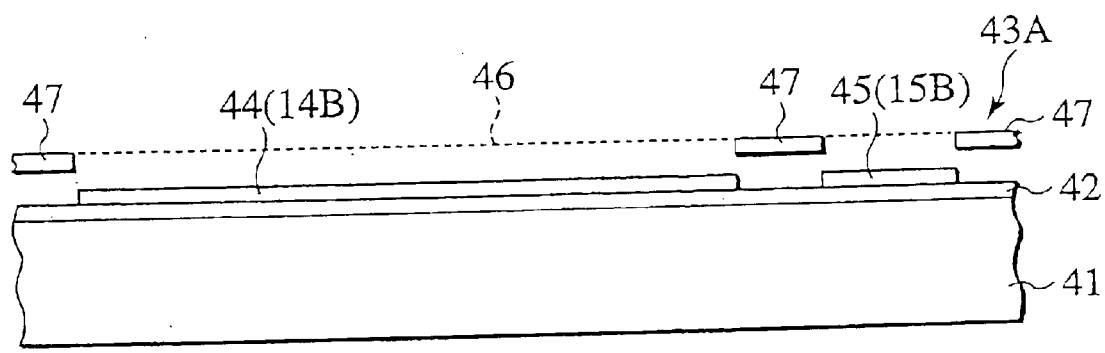
FIG. 15 is a process sectional view which shows a production method of a piezoelectric/electrostrictive element according to the first embodiment of the invention.

(3) Next, a platinum (Pt) paste is printed in a direction, as indicated by arrow y in FIG. 14, using screens (printing plates) 43A, as illustrated by hatching, and dried. The screens 43A is set to 360 in mesh and 5 μm in emulsion film thickness. In this process, portions corresponding to the upper surface portions 14B and 15B of the external electrode layers 14 and 15 of the piezoelectric/electrostrictive element 10 of the first embodiment are printed. The use of the screen 43A, as illustrated by hatching in FIG. 14, enables simultaneous printing over the plurality of element-forming areas along the x direction. FIG. 15 shows Pt paste films 44 and 45 printed at an interval array from each other using the screen 43A within one of the element-forming areas on the disappearing film 42. An area including the Pt paste films 44 and 45 and an intervening area is set to equal to that of a wider one of bottom surfaces an unbaked preform of the piezoelectric/electrostrictive element 10. The screen 43A, as shown in FIG. 15, works to stick an emulsion film 47 to the metal screen 46 in a given pattern and transfer platinum pastes to the disappearing films 42 by pattern portions on which the emulsion layer 47 does not exist.

Figure 16:
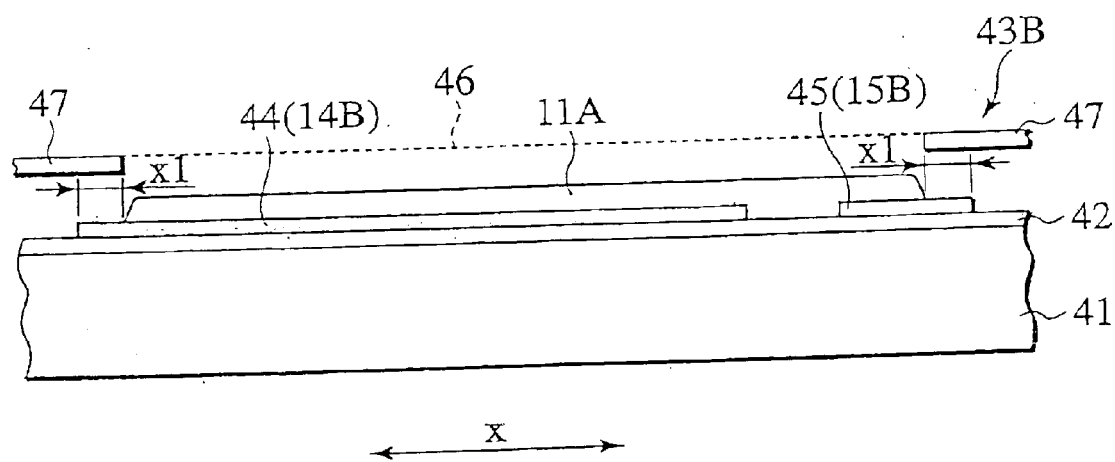
FIG. 16 is a process sectional view which shows a production method of a piezoelectric/electrostrictive element according to the first embodiment of the invention.

(4) Next, a piezoelectric paste is, as shown in FIG. 16, printed using a screen 43B and dried to form an unbaked preform of a first one of the piezoelectric/electrostrictive layers 11A. The screen 43B is provided by forming the emulsion layer 47 having a thickness of 25 μm in a given pattern on the 360 mesh metal screen 46. A pattern of an opening of the emulsion layer 47 is determined to be slightly smaller than the above described area including the Pt paste films 44 and 45 and the intervening area therebetween. For details, the unbaked preform of the piezoelectric/electrostrictive layer 11A printed by the screen 43B are located at both x-direction edges inside x-direction outside edges of the Pt paste films 44 and 45 by a distance x1. Both y-direction side edges of the unbaked preform of the piezoelectric/electrostrictive layer 11A overlap both y-direction side edges of each of the Pt paste films 44 and 45.

Figure 17:
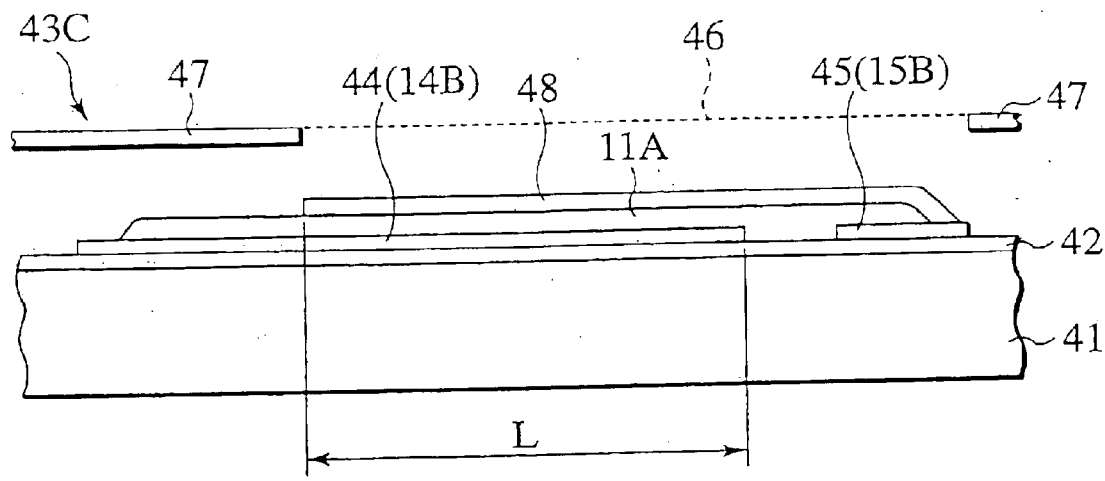
FIG. 17 is a process sectional view which shows a production method of a piezoelectric/electrostrictive element according to the first embodiment of the invention.

(5) Next, a Pt paste film 48 is, as shown in FIG. 17, printed using a screen 43C which will be a Pt film serving as the internal electrode layer 12A and the slant surface portion 15A of the external electrode layer 15 after firing and then dried. The Pt paste film 48 is laid to overlap a given length L of the Pt paste film 44 in the x direction that is formed in the above process through the unbaked preform of the piezoelectric/electrostrictive layer 11A. Overlapped portions of the Pt paste films 44 and 48 function as voltage-applying electrodes effectively.

Figure 18:
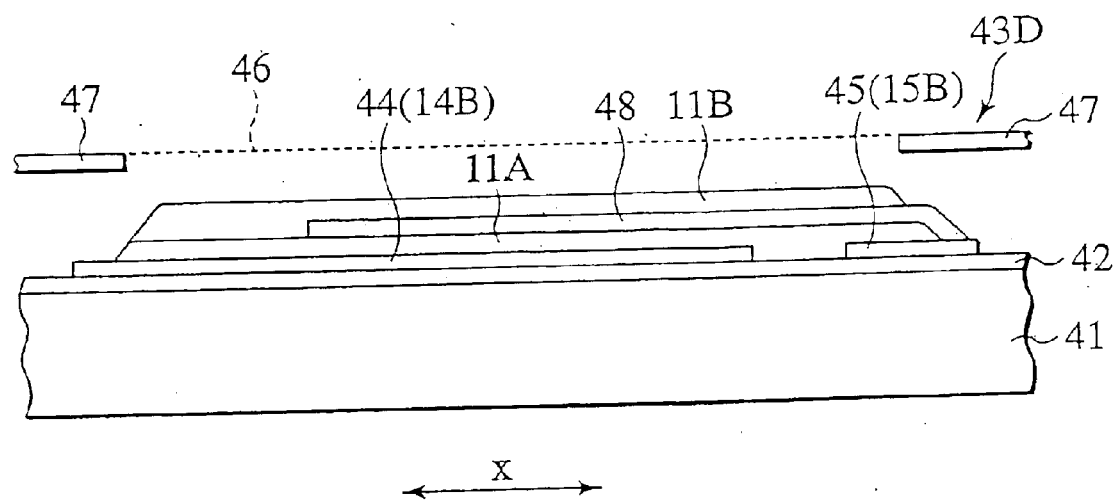
FIG. 18 is a process sectional view which shows a production method of a piezoelectric/electrostrictive element according to the first embodiment of the invention.

(6) Afterwards, a piezoelectric paste is, as shown in FIG. 18, printed using a screen 43D and dried to form an unbaked preform of the piezoelectric/electrostrictive layer 11B. One of x-direction edges of the unbaked preform of the piezoelectric/electrostrictive layer 11B is located on an extension of a slant surface portion of the Pt paste film 48 connecting with the Pt paste film 45. The other edge of the preform of the piezoelectric/electrostrictive layer 11B is located slightly inside an edge of the unbaked preform of the piezoelectric/electrostrictive layer 11A and on an extension of a slant surface portion of the unbaked preform of the piezoelectric/electrostrictive layer 11A.

Figure 19:
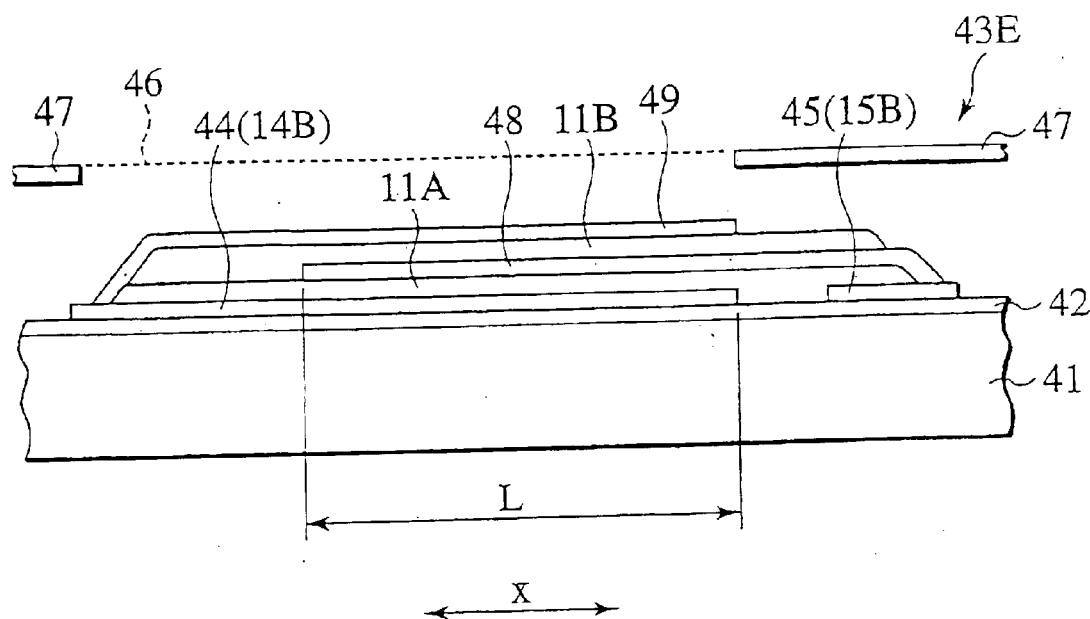
FIG. 19 is a process sectional view which shows a production method of a piezoelectric/electrostrictive element according to the first embodiment of the invention.

(7) Next, a Pt paste film 49 is, as shown in FIG. 19, printed using a screen 43E which will be a Pt paste film 49 serving as the internal electrode layer 12B and the slant surface portion 14A of the external electrode layer 14 after firing and then dried. The Pt paste film 49 is opposed to the Pt paste film 48 through the unbaked preform of the piezoelectric/electrostrictive layer 11B. The Pt paste films 48 and 49 overlap each other by the distance L in the x direction.

Figure 20:
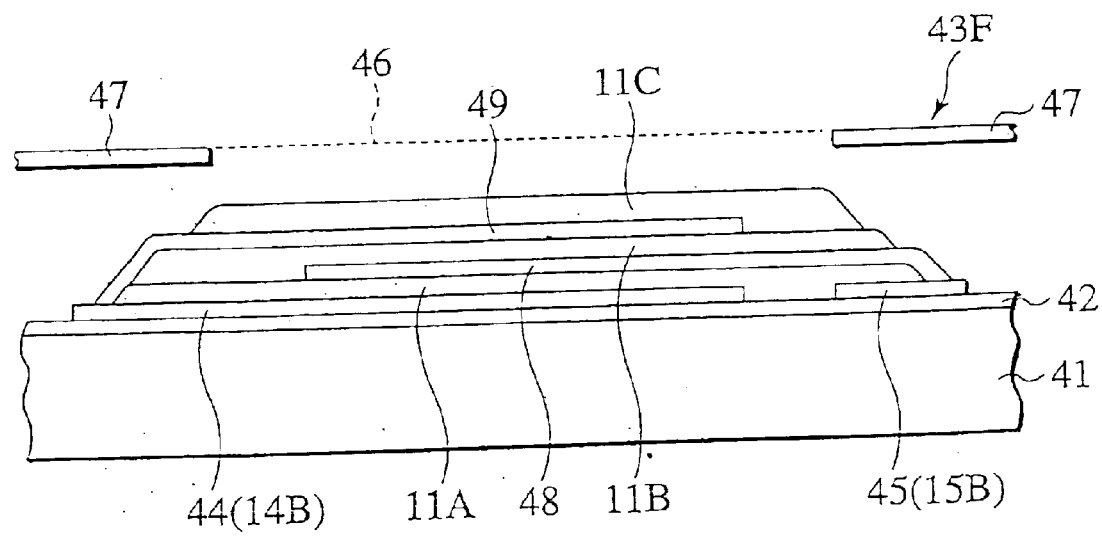
FIG. 20 is a process sectional view which shows a production method of a piezoelectric/electrostrictive element according to the first embodiment of the invention.

(8) Further, a piezoelectric paste is, as shown in FIG. 20, printed using a screen 43F which is smaller in width (length in the x direction) than the unbaked preform of the piezoelectric/electrostrictive layer 11B serving as ground coat and then dried to form an unbaked preform of the piezoelectric/electrostrictive layer 11C. The unbaked preform of the piezoelectric/electrostrictive layer 11C is slightly inside an edge of the unbaked preform of the piezoelectric/electrostrictive layer 11B exposed at one side from the Pt paste film 49 and the slant surface portion of the Pt paste film 49.

Figure 21:
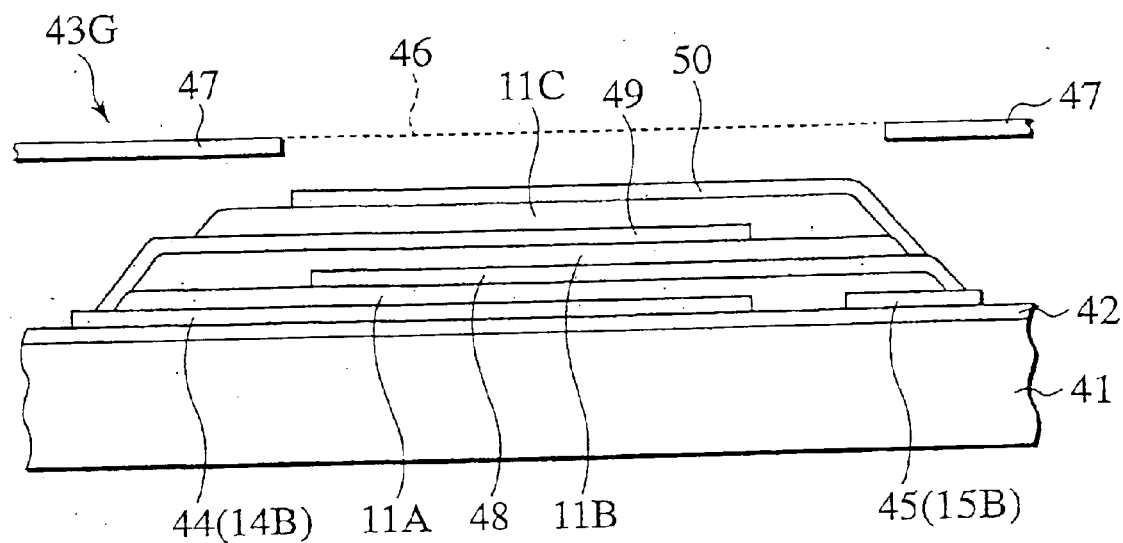
FIG. 21 is a process sectional view which shows a production method of a piezoelectric/electrostrictive element according to the first embodiment of the invention.

(9) Afterwards, a Pt paste film 50 is, as shown in FIG. 21, printed using a screen 43G which serves as the internal electrode layer 12C and the slant surface portion 15A of the external electrode layer 15 after firing and then dried.

Figure 22:
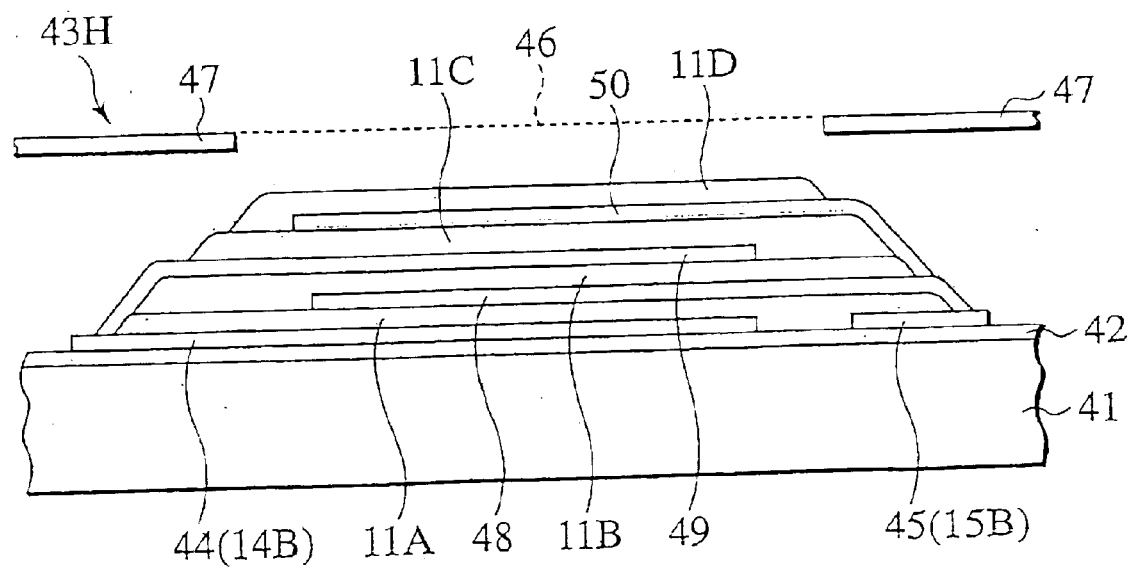
FIG. 22 is a process sectional view which shows a production method of a piezoelectric/electrostrictive element according to the first embodiment of the invention.

(10) Next, a Pt paste is, as shown in FIG. 22, printed using a screen 43H and then dried to form an unbaked preform of the piezoelectric/electrostrictive layer 11D. The preform of the piezoelectric/electrostrictive layer 11D is set smaller in width than the unbaked preform of the piezoelectric/electrostrictive layer 11C serving as ground coat.

Figure 23:
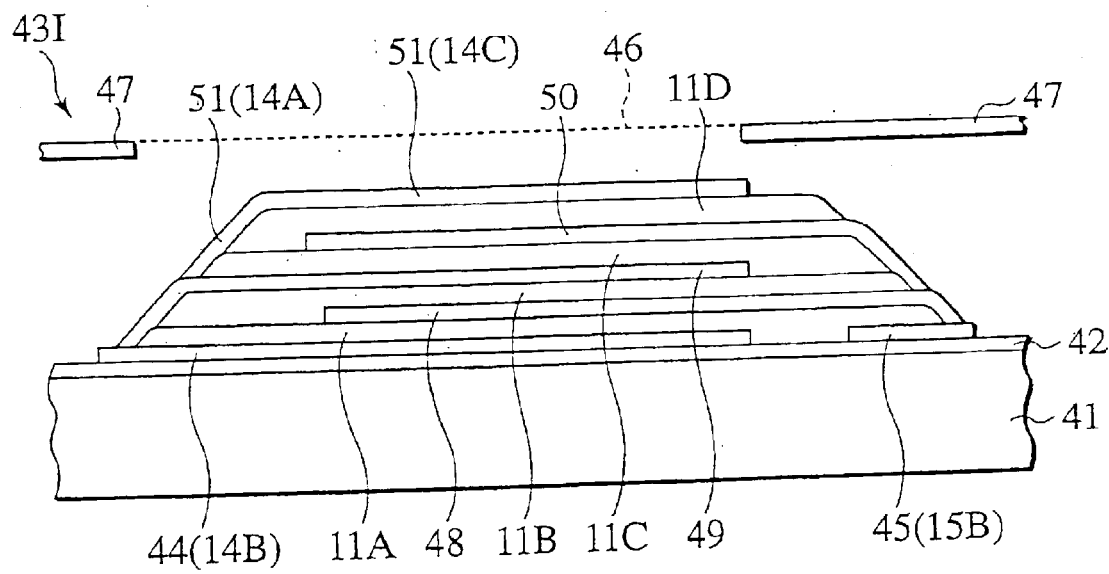
FIG. 23 is a process sectional view which shows a production method of a piezoelectric/electrostrictive element according to the first embodiment of the invention.

(11) Afterwards, a Pt paste film 51 is, as shown in FIG. 23, printed using a screen 43I which serves as the lower surface portion 14C and the slant surface portion 14A of the external electrode layer 14 after firing and then dried. The screen 43I as used in this process is provided by forming the emulsion layer 47 having a thickness of 5 μm in a given pattern on the 360 mesh metal screen 46.

Figure 24:
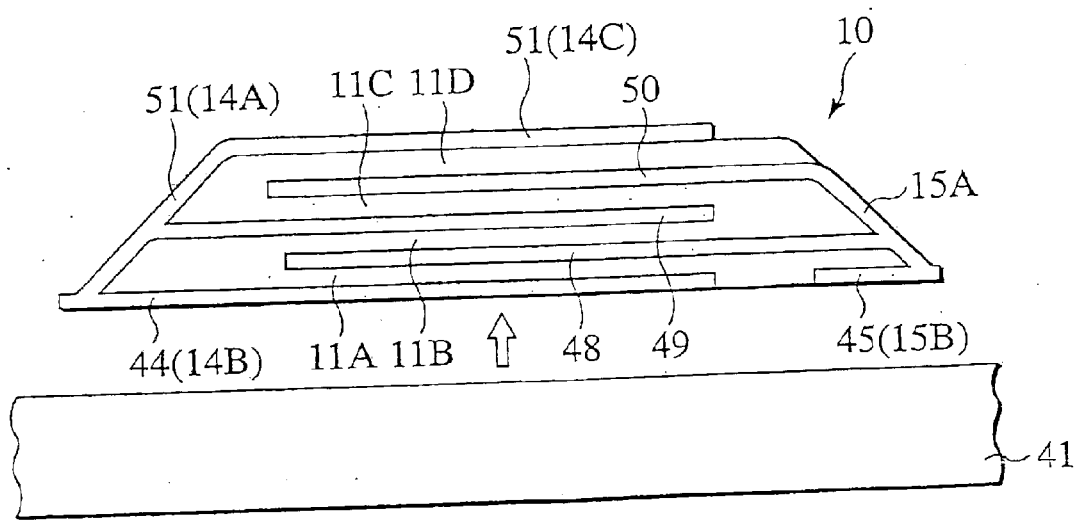
FIG. 24 is a process sectional view which shows a production method of a piezoelectric/electrostrictive element according to the first embodiment of the invention.

(12) Finally, the temperature is increased at a rate which does not leave organic components of each material layer and the disappearing films 42 to perform the firing at a maximum temperature of 1100 to 1300° C., thereby causing the disappearing films 42 to disappear, as shown in FIG. 24, to allow the piezoelectric/electrostrictive elements 10 to be removed easily from the ceramic substrate 41.

It is possible for the production method of the piezoelectric/electrostrictive elements 10 to stack the piezoelectric/electrostrictive layers 11A, 11B, 11C, and 11D in the printing method so as to decrease in area gradually, thus resulting in ease of manufacture of the piezoelectric/electrostrictive elements 10. It is also possible to form the piezoelectric/electrostrictive layers 11A, 11B, 11C, and 11D and each electrode layer (i.e., the Pt film in this embodiment) in the printing method, thus eliminating the need for handling and transportation. This enables the manufacture of the piezoelectric/electrostrictive elements 10 that are higher in dimensional and positional accuracy without adverse effects such as deformation caused by handling or transportation.

The formation of the side portions of the laminate (i.e., both sides in the x direction) which become the continuous external electrodes is achieved by forming the piezoelectric/ electrostrictive layer and the electrode layer repeatedly, thereby eliminating the need for an additional process of forming external electrode layers, resulting in a decrease in process.

Further, easy removal of the piezoelectric/electrostrictive elements 10 after firing is achieved by forming the disappearing films 42 on the ceramic substrate 41 which will disappear by the firing process prior to producing the piezoelectric/electrostrictive elements 10. The disappearing films 42 disappear in the firing process by sublimation and burning, thereby preventing particles from sticking to the piezoelectric/electrostrictive elements 10.

In the production method of the piezoelectric/electrostrictive elements, a variety of piezoelectric materials and conductive pastes that are screen printable may be selected.

The production method of the piezoelectric/electrostrictive elements enables the formation of the external electrode layers in the printing method with a higher positioning accuracy, which achieves accurate positioning of the piezoelectric/electrostrictive elements when disposed and secured on, for example, a movable plate.

Second Embodiment
Piezoelectric/Electrostrictive Element

Figure 25:
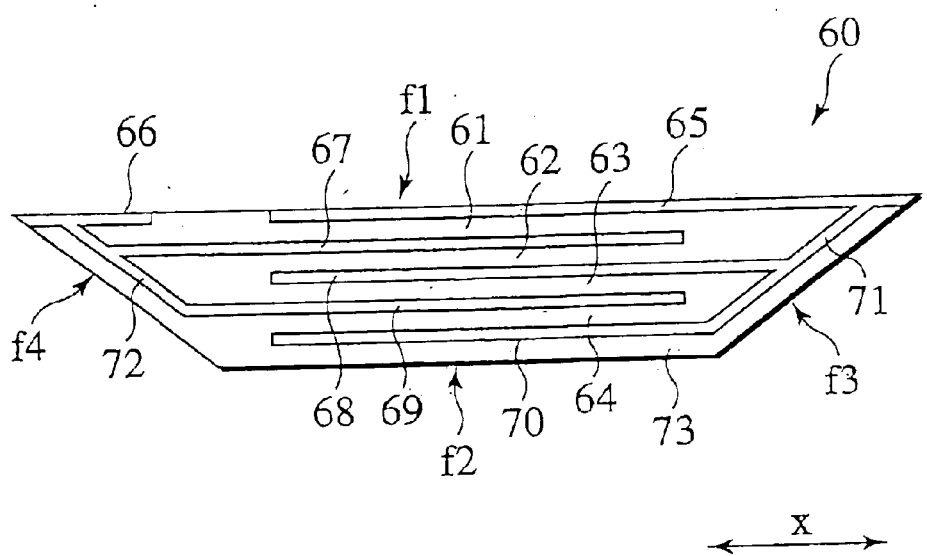
FIG. 25 is a side view of a piezoelectric/electrostrictive element according to the second embodiment of the invention.
Figure 26:
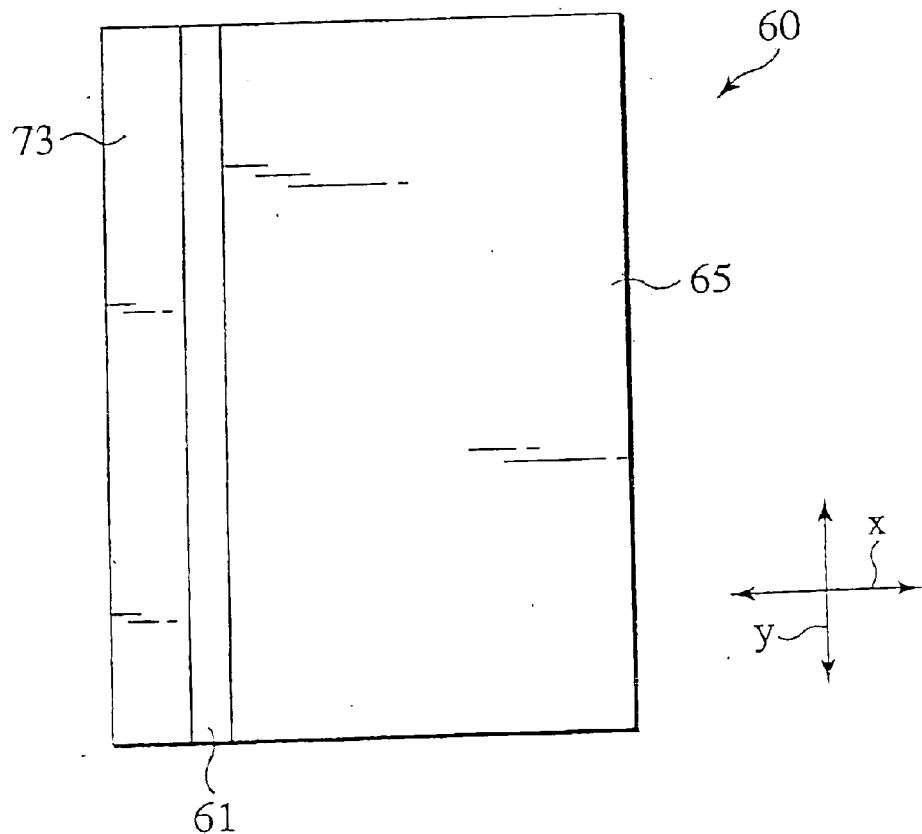
FIG. 26 is a plan view of a piezoelectric/electrostrictive element according to the second embodiment of the invention.

FIGS. 25 and 26 show a piezoelectric/electrostrictive element according to the second embodiment of the invention. FIG. 25 is a side view of the piezoelectric/electrostrictive element 60. FIG. 26 is a plan view of the piezoelectric/electrostrictive element 60. The piezoelectric/electrostrictive element 60, as shown in the drawings, consists of four piezoelectric/electrostrictive layers 61, 62, 63, and 64, upper surface electrode layers 65 and 66 formed at an interval away from each other on an outside surface of the piezoelectric/electrostrictive layer 61, internal electrode layers 67, 68, 69, and 70 formed on lower surfaces of the piezoelectric/electrostrictive layers 61, 62, 63, and 64, a slant surface portion 71 leading to an upper surface electrode 65 in connection with the internal electrode layers 68 and 70, a slant surface portion 72 leading to an upper surface electrode 66 in connection with the internal electrode layers 67 and 69, and an insulating layer 73 covering the slant surface portions 71 and 72 and the internal electrode layer 70.

The piezoelectric/electrostrictive element 60 has a substantially trapezoidal laminated structure having a pair of opposed upper and lower bottom surfaces of rectangular shape. The insulating layers 73 is made of material which may be the same material as that of the piezoelectric/electrostrictive layer 61 or different therefrom.

Both side edges of the bottom surface f2 are, as shown in FIG. 25, located inside side edges of the bottom surface f1 by equal distances, thereby forming slant surfaces f3 and f4 on both sides of the piezoelectric/electrostrictive element 60 in the x direction. The slant surfaces f3 and f4 are inclined in a direction in which they approach each other from the wider bottom surface f1 to the narrower bottom surface f2.

The upper surface electrode layer 65 is wider than the upper surface electrode layer 66. The upper surface electrode layer 65 and the internal electrode layers 68 and 70 are so formed as to extend from the slant surface portion 71 to the slant surface f4. The internal electrode layers 67 and 69 are so formed as to extend from the slant surface portion 72 leading to the upper surface electrode layer 66 to the side of the slant surface f3.

In the piezoelectric/electrostrictive element 60, areas of the upper surface electrode layer 65 and the internal electrode layers 67, 68, 69, and 70 which overlap each other through the piezoelectric/electrostrictive layers practically define voltage-applied areas or voltage-detecting areas.

In the piezoelectric/electrostrictive element 60 of the second embodiment, the bottom surface f2 and the slant surfaces f3 and f4 are covered with the insulating layer 73. Wires leading to a voltage applying circuit or a voltage detecting circuit are, thus, to be connected to the upper surface electrode layers 65 and 66 of the bottom surface f1.

In the piezoelectric/electrostrictive element 60 of the second embodiment, the piezoelectric/electrostrictive layers 61, 62, 63, and 64 are made of, for example, zirconium lead titanate (PZT). The internal electrode layers 67, 68, 69, and 70, the upper surface electrode layers 65 and 66, and the slant surface portions 71 and 72 are made of, for example, platinum (Pt).

In the piezoelectric/electrostrictive element 60, the piezoelectric/electrostrictive layers 61, 62, 63, and 64 laminated from the bottom surface f1 to the bottom surface f2 are decreased in width (length in the x direction) gradually. As a result, in the whole of the piezoelectric/electrostrictive element 60, the slant surfaces f3 and f4 are, as describe above, formed on the side portions.

In this embodiment, the piezoelectric/electrostrictive layers 61, 62, 63, and 64 are four layers. The electrode layers holding the piezoelectric/electrostrictive layers therebetween are five layers, however, the number of the layers and the number of the internal electrode layers connecting with the slant surface portions 71 and 72 may be equal to each other or not. The number of the electrode layers are determined in terms of relations to a drive voltage and the degree of displacement. An increase in total number of the piezoelectric/electrostrictive layers will cause a driving force driving the movable plate on which the piezoelectric/electrostrictive element 60 is installed to be increased, thus enabling a greater displacement and result in an increase in rigidity of the piezoelectric/electrostrictive element 60, thereby increasing the resonance frequency, which allows the speed of a displacement operation to be increased easily.

Piezoelectric/Electrostrictive Device

Figure 27:
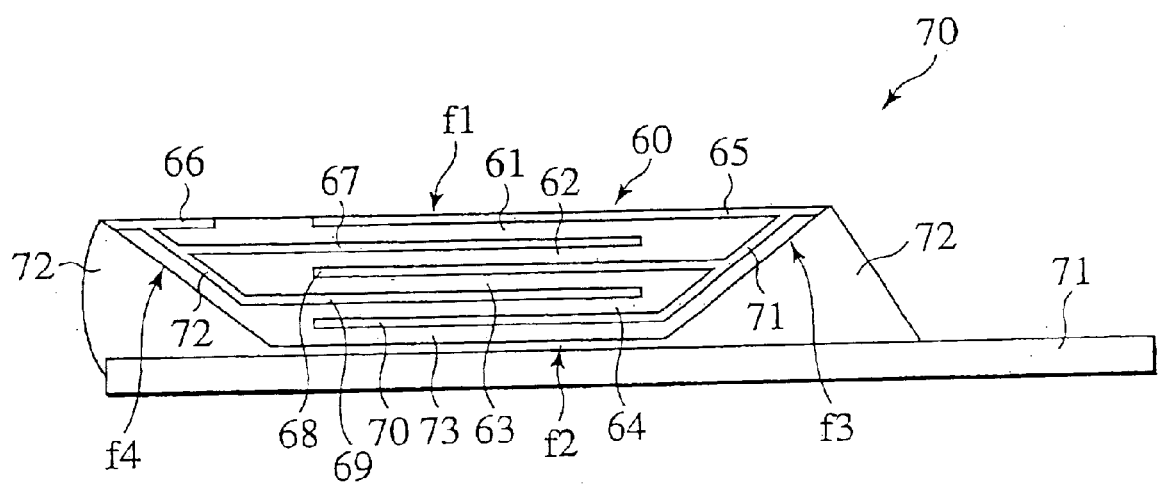
FIG. 27 is a side view of a piezoelectric/electrostrictive device according to the second embodiment of the invention.

FIG. 27 is a side view of a piezoelectric/electrostrictive device 70 according to the second embodiment. The piezoelectric/electrostrictive device 70 is constructed to be of a unimorph type wherein the narrower bottom surface f2 of the above described piezoelectric/electrostrictive element 60 is joined to a movable plate (diaphragm) 71 using adhesive 72. In the piezoelectric/electrostrictive device 70 of the second embodiment, the movable plate 71 is identical in width. The length of the movable plate 71 is greater than that of the piezoelectric/electrostrictive element 60. The movable plate 71 may have flexibility and mechanical strength which withstands breakage caused by bending. Material may be selected in terms of the response and operationability.

In the piezoelectric/electrostrictive device 70, the adhesive 72 is interposed between an upper surface of the movable plate 71 and a bottom surface (lower surface f2 and the slant surfaces f3 and f4 of the piezoelectric/electrostrictive element 60 to bond the piezoelectric/electrostrictive element 60 on the upper surface of the movable plate 71. Particularly, V groove-shaped gaps defined between the slant surfaces f3 and f4 of the piezoelectric/electrostrictive element 60 and the upper surface of the movable plate 71 are filled with the adhesive 72. As a result, the shape defined by the piezoelectric/electrostrictive element 60 and the adhesive 72 will be substantially trapezoidal or rectangular.

The movable plate 71 is a portion which operates based on driving of the piezoelectric/electrostrictive element 70 and has a variety of parts installed thereon according to the purpose of use of the piezoelectric/electrostrictive device 70. For instance, in a case where the piezoelectric/electrostrictive device 70 is used as a displacement element, a shielding plate of an optical shutter etc. is installed. In a case where the piezoelectric/electrostrictive device 70 is employed to position a magnetic head of a hard disc drive or in a ringing inhibiting mechanism, parts such as a magnetic head, a slider with the magnetic head, or a suspension with a slider which are required to be positioned are installed.

The movable plate 71 is a portion driven by the displacement of the piezoelectric/electrostrictive elements 60. The movable plate 71 is a flexible member and performs a function of amplifying as a bending displacement an expansion/contraction displacement of the piezoelectric/electrostrictive elements 60 that is disposed on the surface of the movable plate portions 71. The material of the movable plate 71 which exhibits the flexibility and mechanical strength less susceptible to breakage caused by the bending displacement may be selected.

As material of the movable plate 71, ceramic including zirconia is desirable. Particularly, material containing a main component of stabilized zirconia or partially stabilized zirconia is desirable as the material of the movable plate 71 because it exhibits a greater mechanical strength, a high toughness, and a small reactivity to the piezoelectric/electrostrictive layers and an electrode material if shaped to have a thin wall.

If the movable plate 71 is made of a metallic material, it is preferably flexible or bendable. For example, as ferrous materials, a variety of stainless steels or a variety of spring steels are desirable. As non-ferrous materials, beryllium copper, phosphor bronze, nickel, or nickel-iron alloy is desirable.

In the thus constructed piezoelectric/electrostrictive device 70, the V groove-shaped gaps defined by the slant surfaces f3 and f4 and the upper surface of the movable plate 71 are formed on both sides of the piezoelectric/electrostrictive element 70 and work as a liquid sumps for the adhesive 72 that is liquid or pastelike. The adhesive 72 held in the gaps is solidified while being kept lump by the surface tension, thereby preventing the adhesive 72 from overflowing to or around the upper side of the piezoelectric/electrostrictive element 60 or the lower side of the movable plate 71. The V groove-shaped gaps defined by the slant surfaces f3 and f4 of the piezoelectric/electrostrictive element 60 and the upper surface of the movable plate 71 may be filled with the adhesive 72 in proper quantities by determining the quantity of the adhesive 72 to be applied to the movable plate 71 to a predetermined value.

The side corners of the lower surface f2 of the piezoelectric/electrostrictive element 60 both have, as described above, obtuse angles, and thus have a greater strength as compared with when they have right angles or acute angles. The increase in strength of the corners serves to avoid the damage or breakage of the corners caused by vibrations of the piezoelectric/electrostrictive element 60 or external forces when the bottom surface (lower surface) f2 of the piezoelectric/electrostrictive element 60 is secured on the movable plate 71.

Further, the stress arising from a thermal expansion difference between the piezoelectric/electrostrictive element 60 and the movable plate 71 is maximized near the ends of the piezoelectric/electrostrictive element 60, but the adhesive 72 in the V groove-shaped gaps works to hold the adhesive strength and reduce the stress because of a low elasticity of the adhesive, thereby avoiding breakage and removal of the piezoelectric element 60 from the movable plate 71.

The upper surface electrode layers 65 and 66 are arranged on the side of the wider bottom surface f1 (i.e., on the same plane), thereby facilitating connection of wire to the upper surface electrode layers 65 and 66.

When used as an active device, the thus constructed piezoelectric/electrostrictive device 70 may be designed as a transducer, an actuator, a frequency domain functional part (a filter), a transformer, a vibrator or a resonator for communications or a power source, an oscillator, or a discriminator. Wires may be provided preferably by a flexible printed circuit (FPC), flexible flat cables (FFC), or bonding wires.

When used as a passive device, the piezoelectric/electrostrictive device 70 may be designed as a ultrasonic sensor, an acceleration sensor, an angular rate sensor, a shock sensor, or a mass sensor.

In the piezoelectric/electrostrictive device 70 of the second embodiment, the adhesive 72 sticks directly to the insulating layer 73 whose surface roughness is great and which covers the bottom surface f2 and the slant surfaces f3 and f4 of the piezoelectric/electrostrictive element 60, thus resulting in an increase in bonding strength as compared with when the adhesive 72 sticks to a metallic electrode.

In the piezoelectric/electrostrictive device 70, by forming the upper surface electrode layers 65 and 66 of the piezoelectric/electrostrictive element 60 in the printing method, the contour of the widest bottom surface f1, patterns of the upper surface electrode layers 65 and 66 are formed precisely, thus enabling the positioning based on the upper surface electrode layers 65 and 66. This allows the piezoelectric/electrostrictive element 60 to be positioned accurately on the movable plate 71.

The piezoelectric/electrostrictive device 70 of the second embodiment is, as described above, of the unimorph type, but may be of a bimorph type.

Production Method of Piezoelectric/Electrostrictive Device

A production method of a piezoelectric/electrostrictive device which may be employed with the first and second embodiments will be described below using FIGS. 28 to 33. The method includes the following steps A–E.

Figure 28:
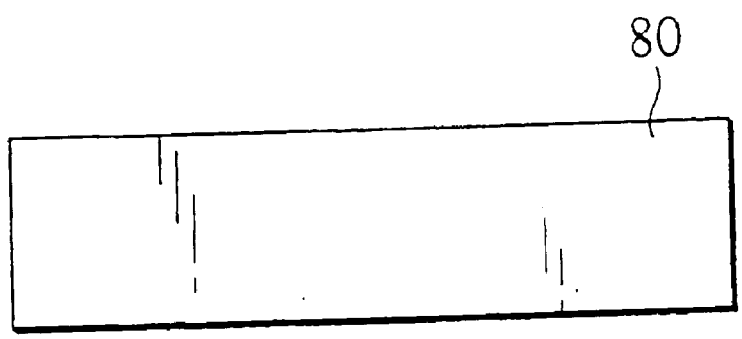
FIG. 28 is a plan view which represents a production method of a piezoelectric/electrostrictive device according to the second embodiment of the invention.
Figure 29:
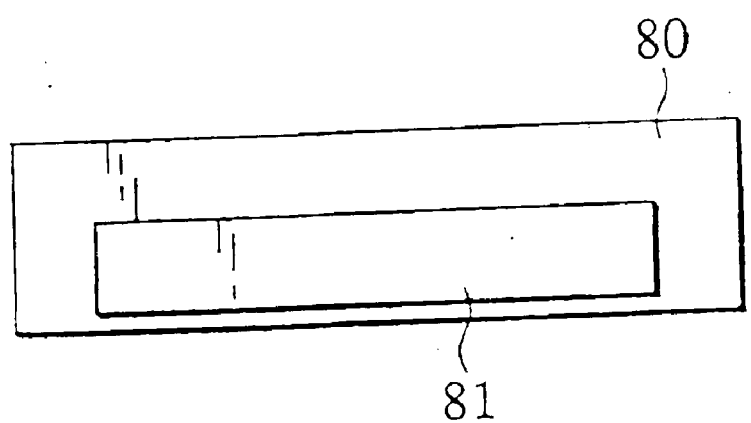
FIG. 29 is a plan view which represents a production method of a piezoelectric/electrostrictive device according to the second embodiment of the invention.

(A) First, a movable plate 80, as shown in FIG. 28, is prepared. An adhesive 81 is, as shown in FIG. 29, applied to a given position of the movable plate 80 using the screen printing method.

Figure 30:
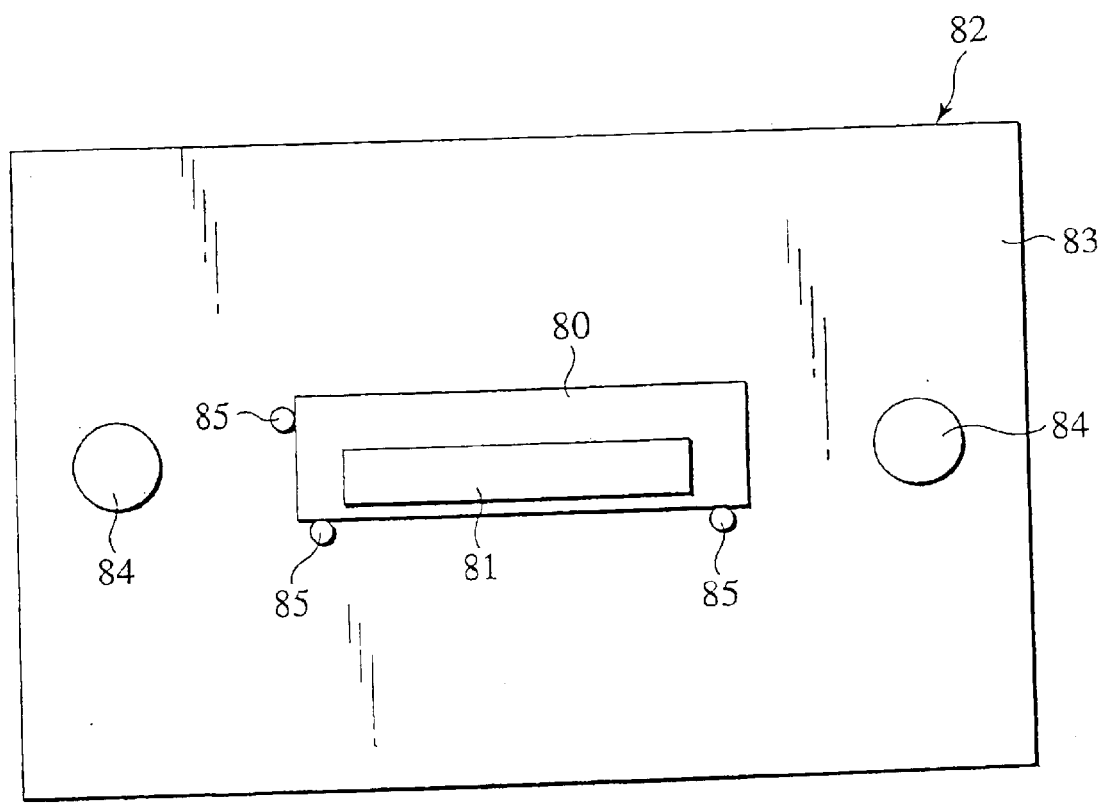
FIG. 30 is a plan view which illustrates a movable plate positioning jig used in a production method of a piezoelectric/electrostrictive device according to the second embodiment of the invention.
Figure 31:
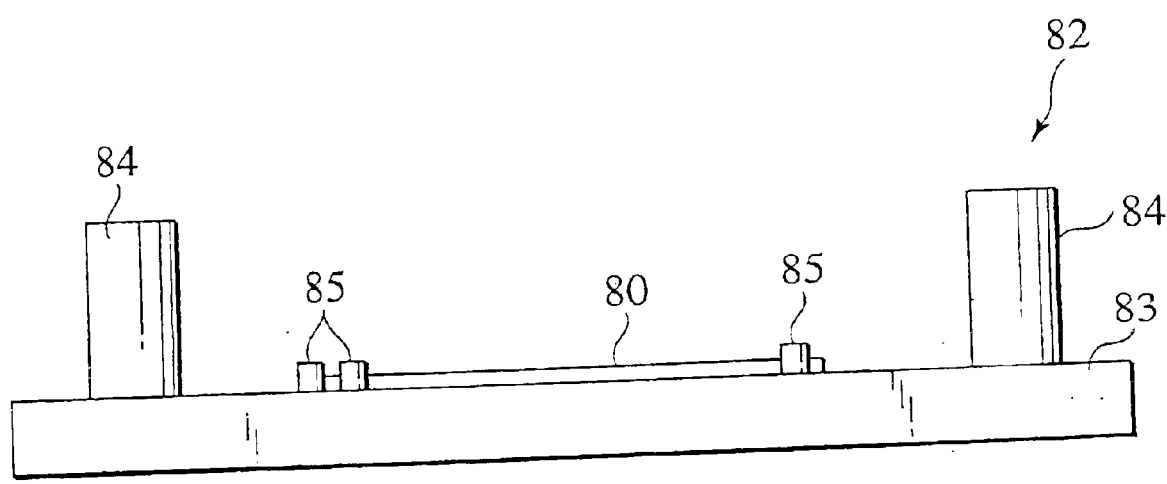
FIG. 31 is a side view which illustrates a movable plate positioning jig used in a production method of a piezoelectric/electrostrictive device according to the second embodiment of the invention.
Figure 32:
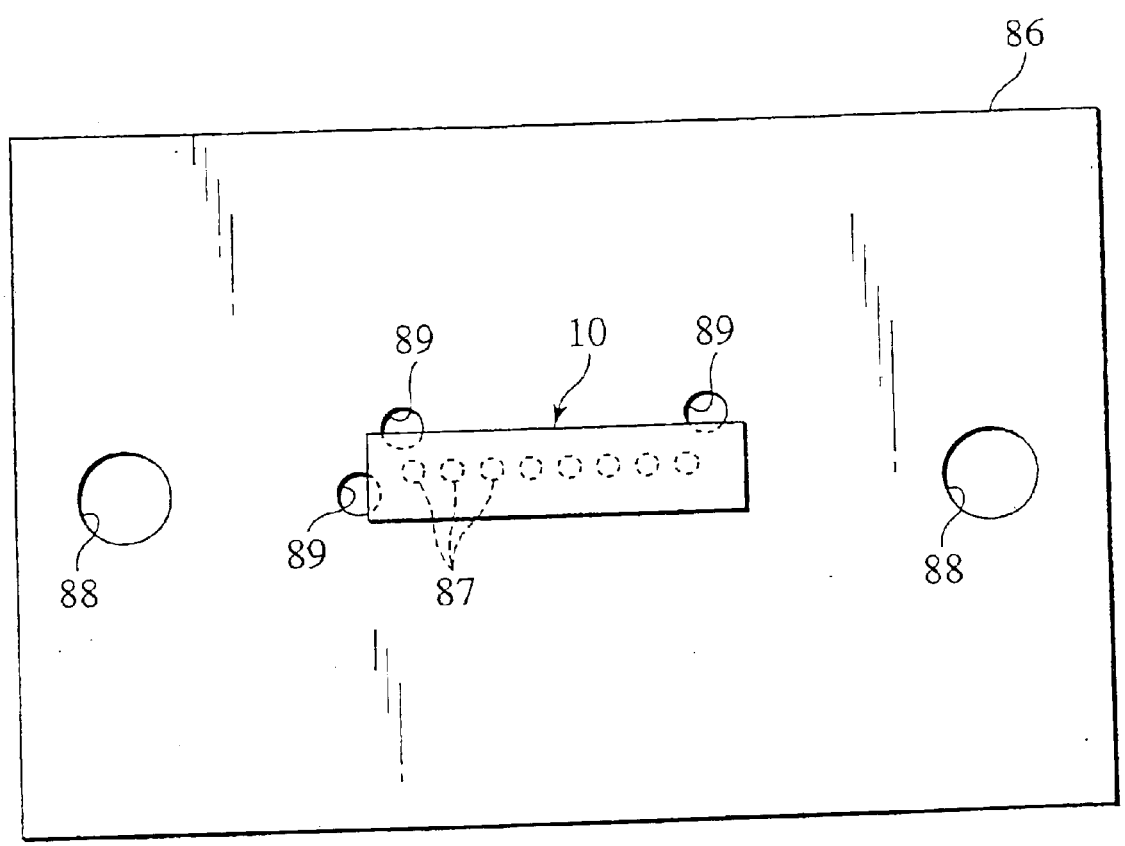
FIG. 32 is a plan view which illustrates an element positioning jig use in a production method of a piezoelectric/electrostrictive device according to the second embodiment of the invention.

(B) Next, the movable plate 80 is, as shown in FIGS. 30 and 31, put on a movable plate positioning jig 82. The movable plate positioning jig 82 has a pair of guide pins 84 installed on side portions of a movable plate positioning substrate 83. Three vertically extending positioning pins 35 are installed on a central portion of the movable plate positioning substrate 83 in engagement with two sides of the movable plate 80.

(C) The piezoelectric/electrostrictive element 10 is set on an element positioning plate 86. The element positioning plate 86 has formed therein a plurality of vacuum openings 87 for fixing in place the piezoelectric/electrostrictive element 10 by use of suction. The piezoelectric/electrostrictive element 10 is set so that the wider bottom surface f1 may be fixed in place by the suction of vacuum openings 87. The element positioning plate 86 has formed therein guide holes 88 in which guide pins 84 are fitted when combined with the movable plate positioning jig 82. The element positioning plate 86 has also formed therein openings 89 for reception of the positioning pins 35 installed on the movable plate positioning jig 82.

Figure 33:
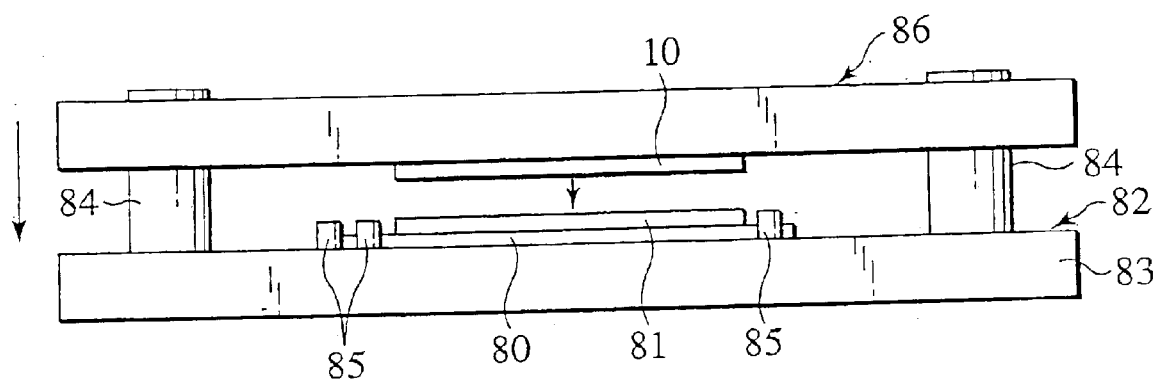
FIG. 33 is a side view which shows a combination of a movable plate positioning jig and an element positioning jig used in a production method of a piezoelectric/electrostrictive device according to the second embodiment of the invention.
Figure 34:
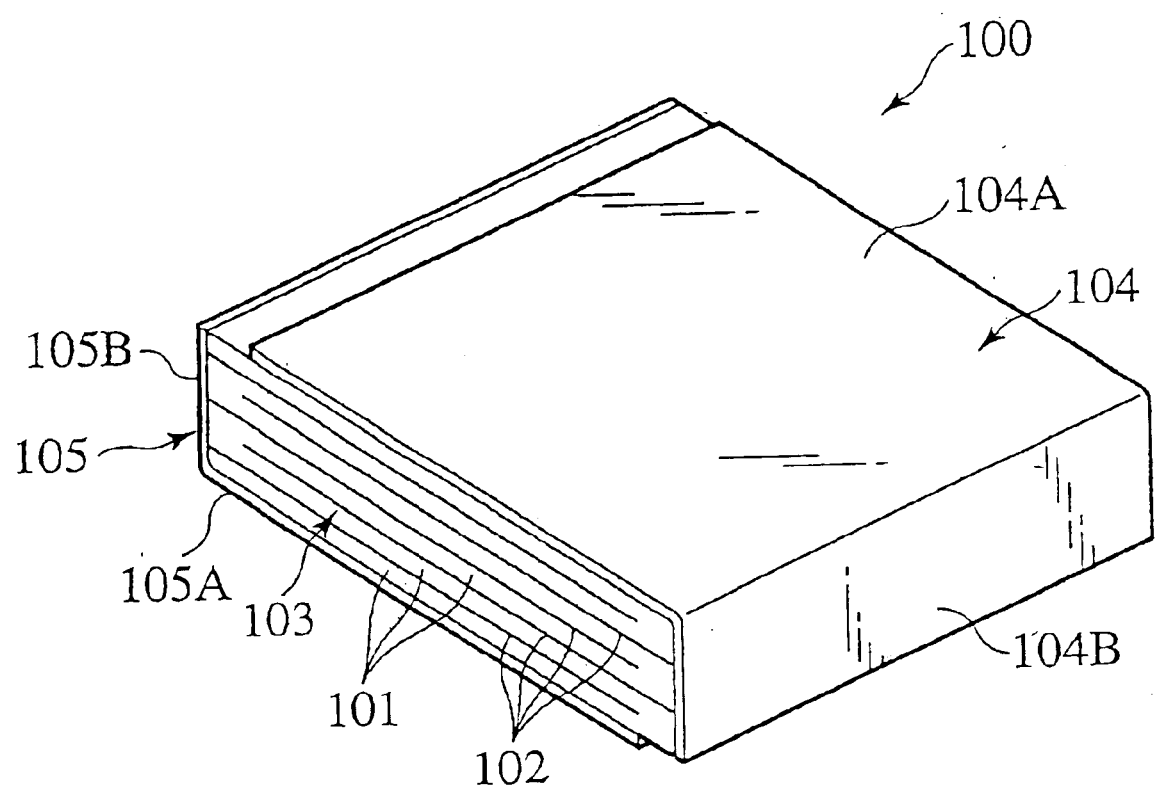
FIG. 34 is a perspective view which shows a conventional piezoelectric/electrostrictive element.
Figure 35:
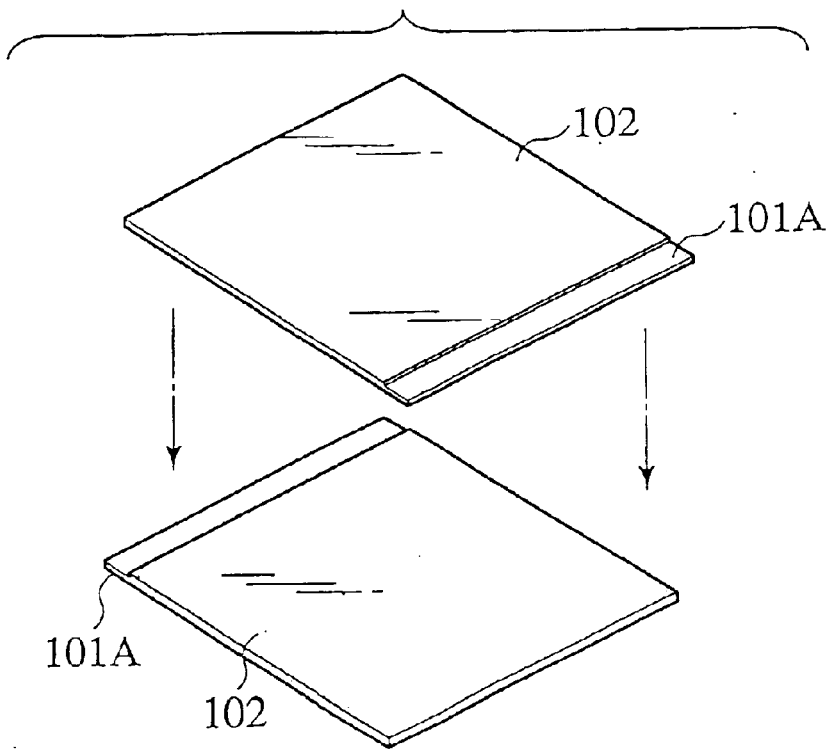
FIG. 35 is a perspective view which shows a production process of a conventional piezoelectric/electrostrictive element.
Figure 36:
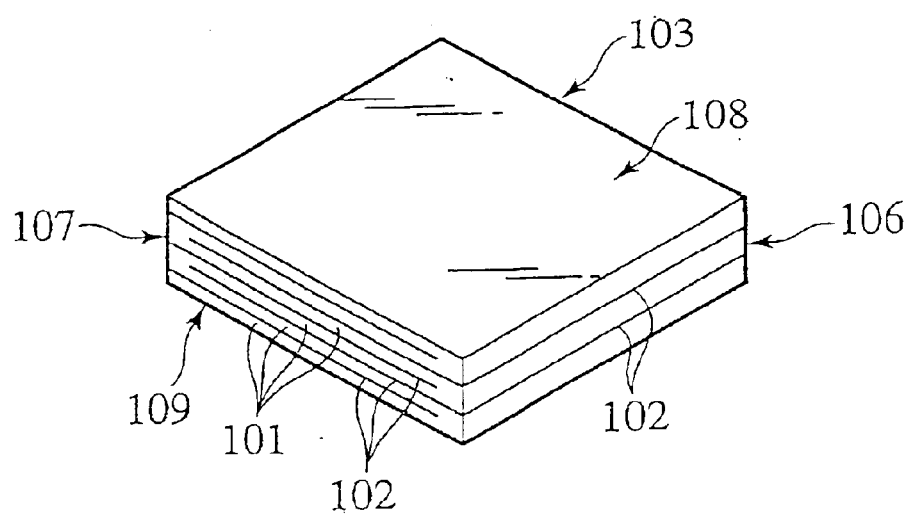
FIG. 36 is a perspective view which shows a laminate of a conventional piezoelectric/electrostrictive element.
Figure 37:
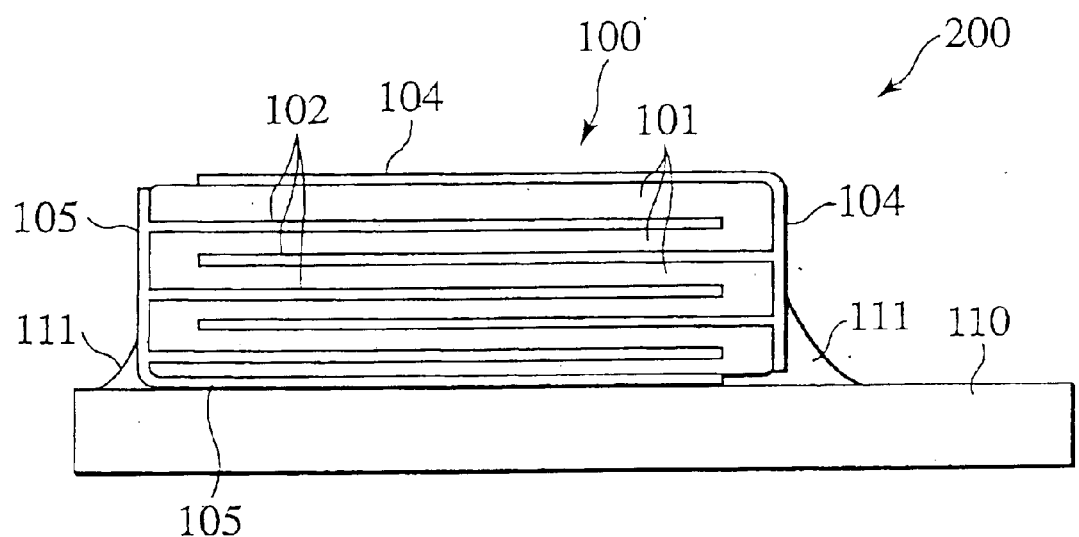
FIG. 37 is a side view which shows a conventional piezoelectric/electrostrictive device.
Figure 38:
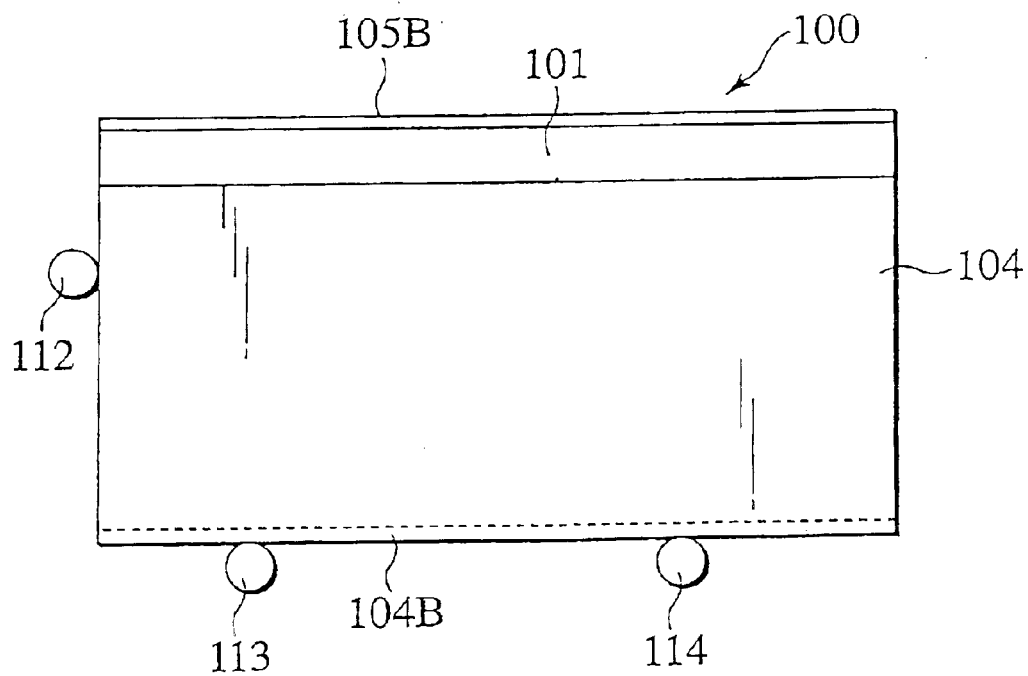
FIG. 38 is an explanatory plan view which shows positioning of a conventional piezoelectric/electrostrictive element.
Figure 39:
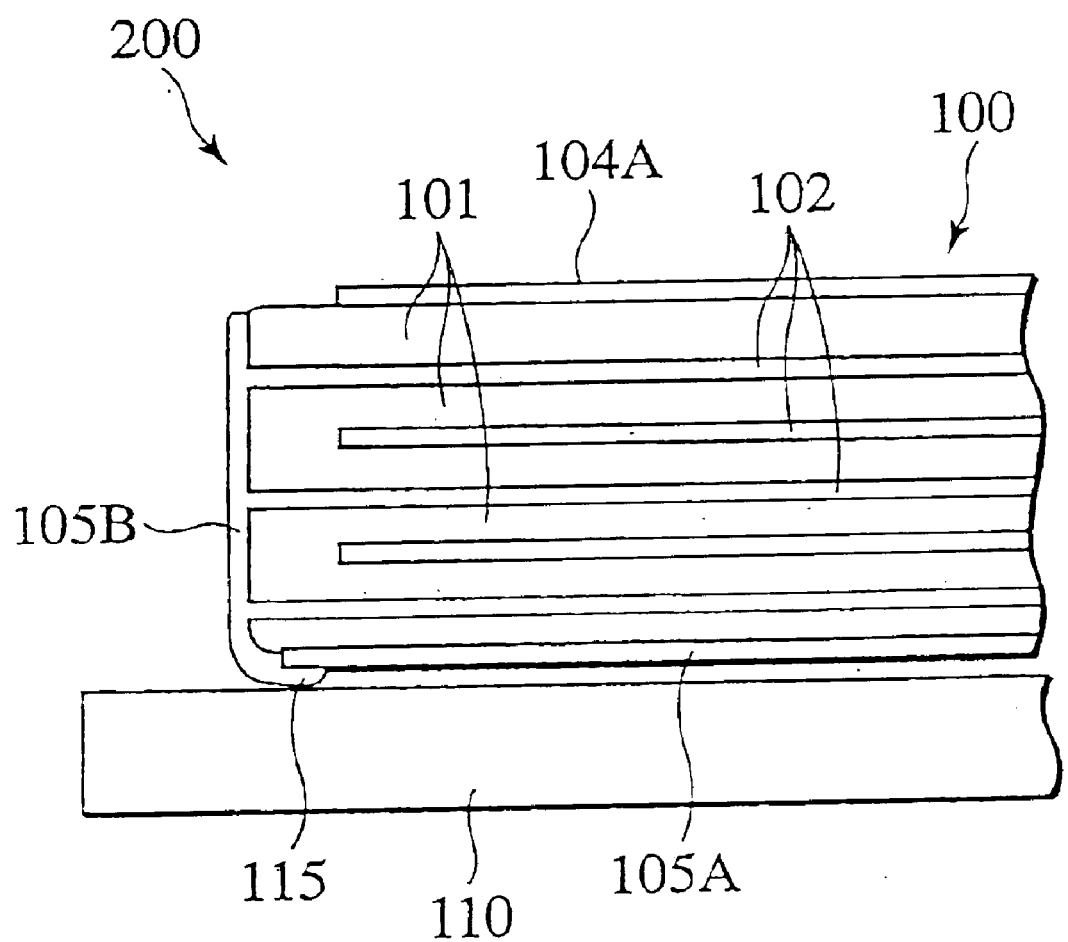
FIG. 39 is an enlarged partial side view of a conventional piezoelectric/electrostrictive element.

(D) The guide pins 84 of the movable plate positioning jig 82 are, as shown in FIG. 33, inserted into the guide holes 88 of the element positioning plate 86. The element positioning plate 86 is brought close to the movable plate positioning jig 82 to bring the piezoelectric/electrostrictive element 10 into contact with the movable plate 80 disposed on the movable plate positioning jig 82, thereby causing the piezoelectric/electrostrictive element 10 to be bonded and secured by the adhesive 81 applied to the movable plate 80.

(E) Afterwards, the suction by the vacuum openings 87 of the element positioning plate 86 is stopped. The element positioning plate 86 is then lifted upward to terminate the positioning of the piezoelectric/electrostrictive element 10.

Afterwards, a weight is put on the piezoelectric/electrostrictive element 10 to hold it from moving during solidification of the adhesive. For example, in a case of a thermosetting one-component epoxy resin adhesive, it is put in an oven heated up to a solidifying temperature. In a case of a UV cured adhesive, an ultraviolet ray is radiated to solidify the bond.

In the above described piezoelectric/electrostrictive device production method, the piezoelectric/electrostrictive element 10 is bonded to one of the surfaces of the movable plate 80. In a case where the piezoelectric/electrostrictive elements 10 are bonded to the surfaces of the movable plate 80, the piezoelectric/electrostrictive element 10 is adhered to one of the surfaces of the movable plate 80 in the above manner, after which another movable plate positioning jig is prepared which is designed to be disposed on the movable plate 80 that is turned over to bond the piezoelectric/electrostrictive element 10 to the reverse surface.

In the above piezoelectric/electrostrictive device production method, proper bonding may be carried out in a proper quantity of the adhesive 81, as shown in FIG. 5, by determining the quantity and thickness of the adhesive 81 to be applied to the movable plate 80 to predetermined values. It is possible to control an applied position and an applied quantity of adhesive accurately, depending upon physical properties (the coefficient of viscosity or thixotropy). Thus, as an application method of the adhesive, the screen printing method is preferably used.

Other Embodiments

It should be noted that the discussion and the drawings that are parts of the disclosure of the above described first and second embodiments of the invention do not limit the invention. From this disclosure, one skilled in the art will know alternative various forms of embodiments, and working techniques.

For instance, the first and second embodiments refer to the cases where the number of the inner electrode layers are three and four, but may be one, two or more, or five or more.

When produced by the printing method, the piezoelectric/electrostrictive elements 10 and 60 have advantages of production, dimensional accuracy, and positional accuracy, but even if the piezoelectric/electrostrictive elements 10 and 60 are not produced by the printing method, they may have the advantage of strength as long as at least the corners of the side portions of the bottom surface have obtuse angles.

In the above described first and second embodiments, the adhesive is put in the V groove-shaped gaps defined by the piezoelectric/electrostrictive element and the movable plate. The invention may also be used in the case where only the narrower bottom surface is bonded by adhesive.

What is claimed:

1. A method of producing a piezoelectric/electrostrictive device in which a piezoelectric/electrostrictive element includes a substantially trapezoidal laminate having narrower and wider surfaces lying substantially in parallel to each other and first and second surfaces opposed to each other between the narrower and wider surfaces, the first and second surfaces being inclined at given angles to one of the narrower and wider surfaces, said laminate being made up of a plurality of piezoelectric/electrostrictive layers and a plurality of internal electrodes each of which is disposed between adjacent two of the piezoelectric/electrostrictive layers, the internal electrodes being broken up into a first and a second group, each of the first group internal electrodes lying over one of the second group internal electrodes through one of the piezoelectric/electrostrictive layers; a first external electrode formed on the first surface of said laminate, said first external electrodes being coupled to the first group internal electrodes; and a second external electrode formed on the second surface of said laminate, said second external electrodes being coupled to the second group internal electrodes, and the piezoelectric/electrostrictive element is bonded to a surface of a movable plate by adhesive.

2. A method of producing a piezoelectric/electrostrictive device as set forth in claim 1, wherein said piezoelectric/electrostrictive elements are bonded to surfaces of said movable plate through adhesive.

3. A method of producing a piezoelectric/electrostrictive device in which a pair of piezoelectric/electrostrictive elements each include a substantially trapezoidal laminate having narrower and wider surfaces lying substantially in parallel to each other and first and second surfaces opposed to each other between the narrower and wider surfaces, the first and second surfaces being inclined at given angles to one of the narrower and wider surfaces, said laminate being made up of a plurality of piezoelectric/electrostrictive layers and a plurality of internal electrodes each of which is disposed between adjacent two of the piezoelectric/electrostrictive layers, the internal electrodes being broken up into a first and a second group, each of the first group internal electrodes lying over one of the second group internal electrodes through one of the piezoelectric/electrostrictive layers; a first external electrode formed on the first surface of said laminate, said first external electrodes being coupled to the first group internal electrodes; and a second external electrode formed on the second surface of said laminate, said second external electrodes being coupled to the second group internal electrodes, and the piezoelectric/electrostrictive elements are bonded to each other on sides of the respective narrower surfaces of said laminates through adhesive.

* * * * *